(12) United States Patent
Watanabe et al.

(10) Patent No.: US 10,944,018 B2
(45) Date of Patent: Mar. 9, 2021

(54) SEMICONDUCTOR FILM AND SEMICONDUCTOR ELEMENT

(71) Applicants: ASAHI KASEI KABUSHIKI KAISHA, Tokyo (JP); TOHOKU UNIVERSITY, Miyagi (JP)

(72) Inventors: Akira Watanabe, Miyagi (JP); Toru Yumoto, Tokyo (JP)

(73) Assignees: Asahi Kasei Kabushiki Kaisha, Tokyo (JP); Tohoku University, Miyagi (JP)

( * ) Notice: Subject to any disclaimer, the term of this patent is extended or adjusted under 35 U.S.C. 154(b) by 339 days.

(21) Appl. No.: 14/415,308

(22) PCT Filed: Jul. 18, 2013

(86) PCT No.: PCT/JP2013/069527
§ 371 (c)(1),
(2) Date: Jan. 16, 2015

(87) PCT Pub. No.: WO2014/014057
PCT Pub. Date: Jan. 23, 2014

(65) Prior Publication Data
US 2015/0200312 A1    Jul. 16, 2015

(30) Foreign Application Priority Data

Jul. 20, 2012  (JP) .............................. JP2012-161771
Mar. 28, 2013  (JP) .............................. JP2013-069880

(51) Int. Cl.
*H01L 31/0256*    (2006.01)
*H01L 31/0264*    (2006.01)
(Continued)

(52) U.S. Cl.
CPC .. *H01L 31/0264* (2013.01); *H01L 31/022425* (2013.01); *H01L 31/032* (2013.01);
(Continued)

(58) Field of Classification Search
CPC ..... H01L 31/00; H01L 31/02; H01L 31/0248; H01L 31/0256; H01L 31/0264;
(Continued)

(56) References Cited

U.S. PATENT DOCUMENTS 3,956,526 A * 5/1976 Ohshima .............. G03G 5/0507
427/73
6,310,282 B1  10/2001 Sakurai et al.
(Continued)

FOREIGN PATENT DOCUMENTS

CN        1363959 A    8/2002
CN     101017872 A    8/2007
(Continued)

OTHER PUBLICATIONS

Wang et al. ("Transparent, flexible and luminescent composite films by incorporating CuInS2 based quantum dots into a cyanoethyl cellulose matrix"); RSC Advances, Janurary 20, 2012, 2, 2675-2677.*
(Continued)

*Primary Examiner* — Christina Chern
(74) *Attorney, Agent, or Firm* — Morgan, Lewis & Bockius LLP

(57) ABSTRACT

The present invention relates to an application liquid for forming a semiconductor film, the application liquid comprising: an inorganic semiconductor particle; and a compound having a relative permittivity of 2 or more or a compound having reducing power against the inorganic semiconductor particle; a method for producing a semiconductor film comprising a step of applying the application liquid; a semiconductor film and a semiconductor element comprising the semiconductor film; and a method for producing the semiconductor element.

16 Claims, 13 Drawing Sheets

(51) Int. Cl.
| | |
|---|---|
| *H01L 31/0392* | (2006.01) |
| *H01L 31/032* | (2006.01) |
| *H01L 31/072* | (2012.01) |
| *H01L 31/074* | (2012.01) |
| *H01L 31/0749* | (2012.01) |
| *H01L 31/18* | (2006.01) |
| *H01L 31/0224* | (2006.01) |

(52) U.S. Cl.
CPC .... *H01L 31/0392* (2013.01); *H01L 31/03923* (2013.01); *H01L 31/03925* (2013.01); *H01L 31/03926* (2013.01); *H01L 31/072* (2013.01); *H01L 31/074* (2013.01); *H01L 31/0749* (2013.01); *H01L 31/18* (2013.01); *H01L 31/1804* (2013.01); *Y02E 10/541* (2013.01); *Y02E 10/547* (2013.01); *Y02E 10/549* (2013.01); *Y02P 70/50* (2015.11)

(58) Field of Classification Search
CPC .............. H01L 31/028; H01L 31/0304; H01L 31/032; H01L 31/0322; H01L 31/0326; H01L 31/0352; H01L 31/072
See application file for complete search history.

(56) References Cited

U.S. PATENT DOCUMENTS

| | | |
|---|---|---|
| 2002/0108649 A1 | 8/2002 | Fujimori et al. |
| 2004/0241551 A1 | 12/2004 | Nakamura et al. |
| 2005/0145163 A1 | 7/2005 | Matsuki et al. |
| 2006/0032755 A1 | 2/2006 | Herman et al. |
| 2006/0214576 A1 | 9/2006 | Takahashi et al. |
| 2007/0190675 A1 | 8/2007 | Yamazaki et al. |
| 2007/0207571 A1 | 9/2007 | Morisue et al. |
| 2007/0287069 A1 | 12/2007 | Fukui |
| 2008/0115826 A1 | 5/2008 | Nishimura et al. |
| 2009/0057612 A1 | 3/2009 | Hosoba et al. |
| 2009/0092855 A1 | 4/2009 | Britton et al. |
| 2010/0267222 A1 | 10/2010 | Robinson et al. |
| 2010/0302707 A1* | 12/2010 | Tan .......................... H01G 4/14 361/323 |
| 2011/0030582 A1 | 2/2011 | Fujdala et al. |
| 2011/0030786 A1 | 2/2011 | Fujdala et al. |
| 2011/0041895 A1 | 2/2011 | Carroll |
| 2011/0079278 A1 | 4/2011 | Dunkley |
| 2011/0132461 A1 | 6/2011 | Orihashi et al. |
| 2011/0217642 A1 | 9/2011 | Heuft et al. |
| 2012/0042953 A1 | 2/2012 | Nishimura et al. |
| 2013/0008502 A1 | 1/2013 | Maruyama |

FOREIGN PATENT DOCUMENTS

| | | | |
|---|---|---|---|
| CN | 101248222 A | 8/2008 | |
| CN | 101443919 A | 5/2009 | |
| CN | 101978509 A | 2/2011 | |
| JP | H04-293971 A | 10/1992 | |
| JP | H07-166161 A | 6/1995 | |
| JP | H07-263722 A | 10/1995 | |
| JP | H09-36399 A | 2/1997 | |
| JP | 2002-100759 A | 4/2002 | |
| JP | 2002-100793 A | 4/2002 | |
| JP | 2003-187637 A | 7/2003 | |
| JP | 2003-234485 A | 8/2003 | |
| JP | 2004-047261 A | 2/2004 | |
| JP | 2004-531902 A | 10/2004 | |
| JP | 2006-501370 A | 1/2006 | |
| JP | 4016419 B2 | 12/2007 | |
| JP | 2008-117798 A | 5/2008 | |
| JP | 2008-140786 A | 6/2008 | |
| JP | 2009-009703 A | 1/2009 | |
| JP | 2009-505930 A | 2/2009 | |
| JP | 2009-074080 A | 4/2009 | |
| JP | 2009-246213 A | 10/2009 | |
| JP | 2010-141165 A | 6/2010 | |
| JP | 2011-006573 * | 1/2011 | ............ C08G 59/68 |
| JP | 2011-159920 A | 8/2011 | |
| JP | 2011-181928 A | 9/2011 | |
| JP | 2011-198848 A | 10/2011 | |
| JP | 2011-201993 A | 10/2011 | |
| JP | 2012-021165 A | 2/2012 | |
| WO | 03/001610 A1 | 1/2003 | |
| WO | 2007/101138 A2 | 9/2007 | |
| WO | 2011/114915 A1 | 9/2011 | |
| WO | 2011/118716 A1 | 9/2011 | |

OTHER PUBLICATIONS

English machine translation of Kobayashi (JP 2011-005673) published Jan. 2011.*
Song et al., "Synthesis and characterization of nanocrystalline mercury telluride by sonochemical method," Journal of Crystal Growth, 269: 317-323 (2004).
Zhavnerko et al., "Formation and deposition of Langmuir-Blodgett films with Thiol-Stabilized CdTe Nanoparticles," Interface Science, 10: 83-89 (2002).
Search Report issued in counterpart European Patent Application No. 13819481.6 dated Jun. 25, 2015.
European Search Report issued in counterpart European Patent Application No. 15193052.6 dated Feb. 9, 2016.
European Search Report issued in counterpart European Patent Application No. 15193301.7 dated Feb. 9, 2016.
International Search Report issued in corresponding International Patent Application No. PCT/JP2013/069527 dated Sep. 17, 2013.
International Preliminary Report on Patentability issued in corresponding International Patent Application No. PCT/JP2013/069527 dated Jan. 29, 2015.

* cited by examiner (A)

(B)

(B)

(C)

(A)

(B)

SEMICONDUCTOR FILM AND SEMICONDUCTOR ELEMENT

TECHNICAL FIELD

The present invention relates to an application liquid for forming a semiconductor film, a semiconductor film and a method for producing the semiconductor film, and a semiconductor element and a method for producing the semiconductor element.

BACKGROUND ART

Currently, development of a solar cell using a substrate comprising a resin, metal foil, or the like as a material has actively been made for the purpose of weight reduction, improving processability, and cost down. As a solar cell that has plasticity and is capable of enduring deformation to some extent, an amorphous silicon solar cell and a CIGS solar cell have become a mainstream of the present time. In addition, vacuum processes such as a plasma CVD method, a sputtering method, and a vapor deposition method have been used for production of solar cells.

Meanwhile, studies on non-vacuum processes have energetically been made. For example, a method for producing a polycrystalline silicon film using a silicon polymer is described in Patent Literature 1. Moreover, studies on a method for producing a CIGS solar cell by a printing method have also been made. In the method, a precursor of copper and indium is printed to form a thin film, and thereafter the solar cell is manufactured through a reduction step and further a selenization step.

CITATION LIST

Patent Literature

Patent Literature 1: Japanese Patent No. 4016419
Patent Literature 2: Japanese Patent Application Laid-Open No. 9-36399

SUMMARY OF INVENTION

Technical Problem

However, it is difficult to obtain a solar cell having a large area by the vacuum processes because the area is limited depending on vacuum apparatuses. Furthermore, utilization efficiency of materials in the vacuum processes is poor. Moreover, the power consumption of apparatuses used in the vacuum processes is large, therefore product costs tend to become high, and environmental load on the earth is large. Moreover, since a high temperature process is necessary, usable substrates are limited.

On the other hand, with respect to the method of Patent Literature 1, although a silicon film can be manufactured, it is not clear whether the film can be used as a solar cell or not, and the performance is unknown. Furthermore, the high temperature process is necessary in the course of manufacturing the silicon film from a silicon polymer. Accordingly, usable substrates are limited.

Moreover, with respect to the printing method, the reduction step and the selenization step are necessary, and therefore there exist the same problems as those of the vacuum processes in terms of costs and the environmental load. Furthermore, also in the printing method, the high temperature process is necessary in the selenization step, and therefore usable substrates are limited.

On the other hand, a solar cell in which a third layer comprising a material having a large band gap is provided between a p-type semiconductor layer and an n-type semiconductor layer is described in Patent Literature 2. Owing to the third layer, the amount of a saturated current during the time when the light does not enter is decreased and the conversion efficiency is improved. However, it is described in Patent Literature 2 that it is suitable that the thickness of the third layer is set to an extent so as not to exceed 20 nm in order for tunnel effect to occur and when the layer thickness exceeds 20 nm, electrons and holes generated by light absorption are inhibited from diffusing to the p-type layer and the n-type layer.

The present invention intends to provide an application liquid for forming a semiconductor film suitably for an application method, with which a semiconductor film having a large area can be manufactured by a low temperature process, and with which cost reduction can be achieved. The present invention also provides a semiconductor film and a method for producing the semiconductor film, each using the application liquid for forming a semiconductor film. The present invention further intends to provide a semiconductor element excellent in power generation efficiency by the layer comprising the above-mentioned film. The present invention further intends to provide a semiconductor element comprising a junction interface layer, the semiconductor element being excellent in power generation efficiency and being low-cost and to provide a method for producing the semiconductor element.

Solution to Problem

The present inventors have made diligent studies in order to solve the problems and, as a result, have completed the present invention.

The present invention provides an application liquid for forming a semiconductor film, the application liquid comprising: an inorganic semiconductor particle; and a compound having a relative permittivity of 2 or more. The present invention also provides an application liquid for forming a semiconductor film, the application liquid comprising: an inorganic semiconductor particle; and a compound having reducing power against the inorganic semiconductor particle.

The present invention also provides a semiconductor film comprising: an inorganic semiconductor particle; and a compound having a relative permittivity of 2 or more. The present invention also provides a semiconductor film comprising: an inorganic semiconductor particle; and a compound having reducing power against the inorganic semiconductor particle. Details of the semiconductor film will be described later.

It is preferable that the aforementioned compound having a relative permittivity of 2 or more be at least one selected from the group consisting of glycerin, thioglycerol, cyano group-containing organic compounds, and polyvinylidene fluoride (PVDF). Moreover, it is preferable that the aforementioned compound having reducing power against the inorganic semiconductor particle be at least one selected from the group consisting of glycerin and thioglycerol.

In addition, the cyano group-containing organic compound means a compound containing one or more cyano groups. Details of the cyano group-containing organic compound will be described later.

It is preferable in the application liquid for forming a semiconductor film of the present invention that the content of the compound having a relative permittivity of 2 or more or the compound having reducing power against the inorganic semiconductor particle be 0.5 to 90% by mass. Moreover, it is preferable in the application liquid for forming a semiconductor film of the present invention that the content of the inorganic semiconductor particle be 0.5 to 70% by mass.

It is preferable in the semiconductor film of the present invention that the content of the compound having a relative permittivity of 2 or more or the compound having reducing power against the inorganic semiconductor particle be 0.5 to 80 mass %. It is preferable in the semiconductor film of the present invention that the content of the inorganic semiconductor particle be 2.0 to 99.5% by mass.

It is preferable that the aforementioned inorganic semiconductor particle be a silicon particle, a compound semiconductor particle, or a titanium oxide particle. It is preferable that the average particle size of the aforementioned silicon particle be 0.1 to 400 μm. Moreover, it is preferable that the average particle size of the aforementioned compound semiconductor particle be 0.05 to 50 μm. Moreover, it is preferable that the average particle size of the aforementioned titanium oxide particle be 0.005 to 50 μm.

The present invention also provides a method for producing a semiconductor film, the method comprising a step of applying the application liquid for forming a semiconductor film to a substrate on which an electrode is formed. The present invention also provides a semiconductor element comprising: a layer comprising the semiconductor film.

The semiconductor element of the present invention is an element comprising: a semiconductor layer or a layer comprising a semiconductor film; or a semiconductor layer and a layer comprising a semiconductor film. Details of the semiconductor element will be described later.

The present invention further provides a semiconductor element comprising: the layer comprising a semiconductor film; and another semiconductor film having an opposite charge to a charge of the semiconductor film or another semiconductor layer having an opposite charge to the charge of the semiconductor film.

In addition, the "semiconductor layer" is different from the "semiconductor film (layer comprising the semiconductor film)" in the present embodiments. The semiconductor film is, as described above, a semiconductor film comprising: an inorganic semiconductor particle; and a compound having a relative permittivity of 2 or more. On the other hand, the semiconductor layer is formed from a semiconductor such as a silicon wafer, an inorganic semiconductor layer, or an organic semiconductor layer. Details concerning the semiconductor layer, and the "semiconductor film (layer comprising the semiconductor film)" will be described later.

The present invention further provides a semiconductor element comprising: the layer comprising a semiconductor film; a layer comprising another semiconductor film having an opposite charge to a charge of the semiconductor film; and a junction interface layer comprising a compound having a relative permittivity of 2 or more between the layer comprising a semiconductor film and the layer comprising another semiconductor film.

In addition, the junction interface layer is a layer provided at a junction interface of the semiconductor layer, the layer comprising a compound having a relative permittivity of 2 or more. Details thereof will be described later.

Examples of such a semiconductor element include a semiconductor element in which the layer comprising a semiconductor film is a layer comprising a p-type semiconductor film and the layer comprising another semiconductor film is a layer comprising an n-type semiconductor film.

The present invention further provides a semiconductor element comprising: the layer comprising a semiconductor film; a semiconductor layer; and a junction interface layer comprising a compound having a relative permittivity of 2 or more between the aforementioned two layers.

Examples of such a semiconductor element include a semiconductor element in which the layer comprising a semiconductor film is a layer comprising a p-type semiconductor film and the semiconductor layer is an n-type semiconductor layer, or the layer comprising a semiconductor film is a layer comprising an n-type semiconductor film and the semiconductor layer is a p-type semiconductor layer.

In this case, it is preferable that the semiconductor layer is a titanium oxide layer, a silicon wafer, or a compound semiconductor layer.

The present invention further provides a semiconductor element comprising: a first semiconductor layer; a second semiconductor layer; and a junction interface layer comprising a compound having a relative permittivity of 2 or more between the first semiconductor layer and the second semiconductor layer. Such a semiconductor element includes a semiconductor element in which the first semiconductor layer is a p-type semiconductor layer and the second semiconductor layer is an n-type semiconductor layer.

In this case, it is preferable that at least one of the semiconductor layers be a titanium oxide layer, a silicon wafer, or a compound semiconductor layer.

It is preferable in the semiconductor element that the compound contained in the junction interface layer, the compound having a relative permittivity of 2 or more be at least one selected from the group consisting of glycerin, thioglycerol, cyano group-containing organic compounds, and PVDF.

In addition, it is preferable that the thickness of the junction interface layer be 0.03 to 500 μm. Moreover, it is preferable that the transmittance of the junction interface layer be 35% or more.

The present invention further provides a method for producing a semiconductor element, the method comprising a step of obtaining a laminate having a layer comprising a compound having a relative permittivity of 2 or more on a p-type semiconductor layer or an n-type semiconductor layer. In this case, the method for producing a semiconductor element may comprise: the above-described step; further, a step of obtaining another laminate having another p-type semiconductor layer or another n-type semiconductor layer on a transparent electrode; and a step of sticking the laminate and the other laminate with the layer comprising a compound having a relative permittivity of 2 or more and the other p-type or n-type semiconductor layer facing each other.

The present invention further provides a method for producing a semiconductor element, the method comprising: a step of obtaining a laminate having a p-type or n-type semiconductor layer and a layer comprising a compound having a relative permittivity of 2 or more in this order on a transparent electrode; and a step of sticking another p-type or n-type semiconductor layer to the layer comprising a compound having a relative permittivity of 2 or more.

It is preferable in the production method that the layer comprising a compound having a relative permittivity of 2 or more be a layer obtained by removing a volatile component from the application liquid comprising the compound having a relative permittivity of 2 or more.

It is preferable in the production method that the compound having a relative permittivity of 2 or more be at least one selected from the group consisting of glycerin, thioglycerol, cyano group-containing organic compounds, and PVDF.

In addition, it is preferable in the present invention that the semiconductor element be a solar cell.

The solar cell of the present invention is a cell comprising: a semiconductor layer, a layer comprising a semiconductor film or a semiconductor layer and a layer comprising a semiconductor film; an electrode; a substrate, in which power is generated by light. Details of the solar cell will be described later.

When the solar cell comprises the layer comprising a semiconductor film, it is preferable that the inorganic semiconductor particle contained in the semiconductor film make contact with the electrode.

Advantageous Effects of Invention

According to the present invention, an application liquid for forming a semiconductor film can be provided in which the application liquid is suitably used for an application method by which obtaining large-area semiconductor films becomes easy and the production of the large-area semiconductor films at low cost becomes possible; and with the application liquid, a semiconductor film can be made by a low temperature process. Moreover, according to the present invention, a semiconductor film that is suitably used for a semiconductor element (solar cell), and a method for producing the semiconductor film can be provided. Moreover, according to the present invention, a semiconductor element (solar cell) that is excellent in power generation efficiency can be provided by comprising the layer that comprises the semiconductor film. Furthermore, according to the present invention, a semiconductor element (solar cell) comprising a junction interface layer, the semiconductor element being excellent in power generation efficiency and being low-cost and a method for producing the semiconductor element can be provided.

DESCRIPTION OF EMBODIMENTS

Figure 1:
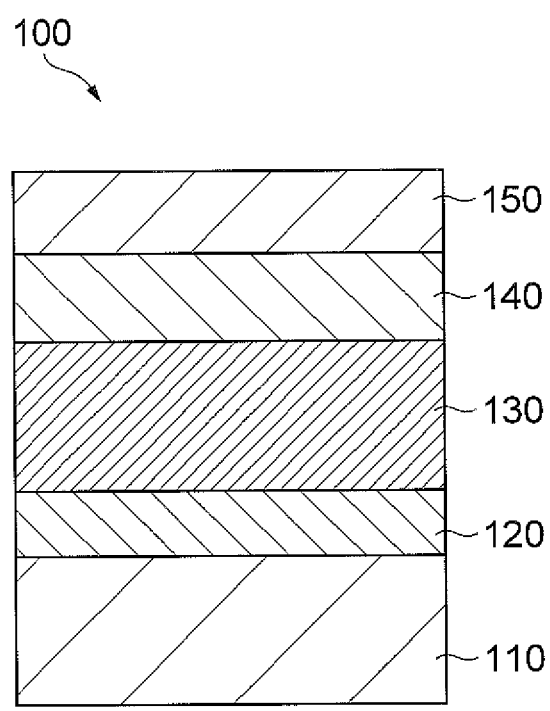
FIG. 1 is a sectional view illustrating an embodiment of a solar cell of the present invention.

Suitable embodiments of the present invention will be described below.

An application liquid for forming a semiconductor film of the present embodiments comprises an inorganic semiconductor particle and a compound having a relative permittivity of 2 or more, or inorganic semiconductor particle and a compound having reducing power against the inorganic semiconductor particle.

(Inorganic Semiconductor Particle)

The inorganic semiconductor particle is a semiconductor particle made of an inorganic substance and in which a current flows in particular conditions. The inorganic semiconductor particles are roughly classified into p-type semiconductor particles and n-type semiconductor particles. The p-type here is a case where a carrier of charge transfer in the semiconductor is a hole. The n-type is a case where the carrier of the charge transfer in the semiconductor is a conduction electron. The hole and conduction electron are together referred to as a carrier. As an inorganic semiconductor particle, a silicon particle, compound semiconductor particles, metal oxide particles, and so on are preferable. The silicon particle is more preferable from the standpoint of carrier transfer and costs.

The silicon particles include a p-type, an n-type, and an i-type silicon particle.

Compounds to be used for the compound semiconductor particle include silicon germanium compounds, CIS-based compounds, GIGS-based compounds, CZTS-based compounds, CGS-based compounds, CdTe compounds, InP compounds, GaAs compounds, GaSb compounds, GaP compounds, InSb compounds, InAs compounds, ZnTe compounds, ZnSe compounds, FeS compounds, CuS compounds, tin sulfide, antimony sulfide, and so on. The CIS-based compound is a compound made of Cu, In, and S, or Cu, In, S, and Se, and an aspect in which both compounds are used together is included. The CIGS-based compound is a compound made of Cu, In, Ga, and S, or Cu, In, Ga, S, and Se, and an aspect in which both compounds are used together is included. The CZTS-based compound is a compound made of Cu, Zn, Sn, and S, or Cu, Zn, Sn, S, and Se, and an aspect in which both compounds are used together is included. The CGS-based compound is a compound made of Cu, Ga, and S, or Cu, Ga, S, and Se, and an aspect in which both compounds are used together is included. In addition, these compounds to be used for the compound semiconductor particle may be used in combination of two or more.

Oxides to be used for the metal oxide particle include metal oxides such as copper (I) oxide, copper (II) oxide, iron oxide, zinc oxide, silver oxide, copper oxide, titanium oxide (rutile, anatase), zinc oxide, and silver oxide. These oxides to be used for the metal oxide particle may be used in combination of two or more.

It is preferable that the inorganic semiconductor particle have a high crystallinity and be a high purity. The crystallinity of the particle can be assessed from full width at half maximum obtained by an X-ray analysis in the case of the compound semiconductor particle and the metal oxide particle and from the resistivity in the case of the silicon particle. It is preferable that the purity of the inorganic semiconductor particle be 99.99% by mass, and more preferably 99.999% by mass.

Description is made in detail on the silicon particle. The method for producing the silicon particle is not particularly limited, and the silicon particle can be produced by, for example, a method using a high crystallinity semiconductor micro particle production apparatus utilizing a pulse pressure addition orifice spraying method, a method of pulverizing a polycrystalline or mono crystalline silicon ingot or wafer, or the like. Moreover, chips during wafer production and so on can also be used as a silicon particle. As a p-type silicon particle, for example, a silicon particle obtained by doping boron, gallium, or the like as an additive is used. As an n-type silicon particle, a silicon particle obtained by doping phosphorus, nitrogen, arsenic, or the like as an additive is used. It is preferable that the concentration of these additives contained in the silicon particle be $10^{12}$ atom/cm$^3$ or more, and more preferably $10^{13}$ atom/cm$^3$ or more. Moreover, it is preferable that the concentration of these additives be $10^{21}$ atom/cm$^3$ or less, and more preferably $10^{20}$ atom/cm$^3$ or less. It is preferable from the standpoint of charge transfer in the semiconductor and spread of a depletion layer that the resistivity of the silicon particle be 0.0001 Ωcm or more, and more preferably 0.001 Ωcm. Moreover, it is preferable that the resistivity of the silicon particle be 1000 Ωcm or less, and more preferably 100 Ωcm or less.

As a method of pulverizing an ingot or wafer, either dry pulverization or wet pulverization may be used, and both methods may be used together. A hummer crusher or the like can be utilized for the dry pulverization. A ball mill, a planetary ball mill, a bead mill, a homogenizer, or the like can be utilized for the wet pulverization. Solvents for the wet pulverization include compounds having a relative permittivity of 2 or more, which will be described later, compounds having reducing power against the inorganic semiconductor particle, and dispersants.

It is preferable from the standpoint of reducing contact resistance among particles that the average particle size of the silicon particle be 400 μm or less, more preferably 200 μm or less, further more preferably 100 μm or less, and extremely preferably 70 μm or less. Moreover, it is preferable from the standpoint of reducing contact resistance between a particle and an electrode and of diffusion length that the average particle size of the silicon particle be 0.1 μm or more, more preferably 1 μm or more, and further more preferably 10 μm or more.

In addition, the diameter (particle size) of the inorganic semiconductor particle such as the silicon particle, the compound semiconductor particle, the metal oxide particle, or the like is measured by the following methods.

With regard to the silicon particle, the particle size is measured by an image processing method using a microscope.

With regard to a particle other than the silicon particle, a solution in which the particle is dispersed is prepared, and the particle size is measured using a dynamic light scattering method.

Description is made in detail on the compound semiconductor particle. The method for producing the compound semiconductor particle is not particularly limited, and the compound semiconductor particle can be produced by, for example, a gas phase method, a liquid phase method, or the like. As a method of pulverizing the obtained particle, either dry pulverization or wet pulverization can be used, or both methods can be used together. A hummer crusher or the like can be utilized for the dry pulverization. A ball mill, a bead mill, a homogenizer, or the like can be utilized for the wet pulverization. Solvents for the wet pulverization include compounds having a relative permittivity of 2 or more, which will be described later, compounds having reducing power against an inorganic semiconductor particle, dispersants, and so on can be used.

It is preferable from the standpoint of reducing contact resistance among particles that the average particle size of the compound semiconductor particle be 50 μm or less, more preferably 20 μm or less, and further more preferably 10 μm or less. Moreover, it is preferable from the standpoint of reducing contact resistance between a particle and an electrode and of diffusion length that the average particle size of the compound semiconductor particle be 0.05 μm or more, more preferably 0.1 μm or more, and further more preferably 0.2 μm or more.

It is preferable from the standpoint of allowing carrier transfer to become favorable that the full width at half maximum in the X-ray analysis of the compound semiconductor particle be 2 degrees or less, and more preferably 1 degree or less.

Description is made in detail on the metal oxide particle. The method for producing the metal oxide particle is not particularly limited, and the metal oxide particle can be produced by, for example, a sol-gel method or the like.

It is preferable from the standpoint of reducing contact resistance among particles and of diffusion length that the average particle size of the metal oxide particle be 0.001 μm or more, more preferably 0.005 μm or more, further more preferably 0.01 μm or more, and extremely preferably 0.05 μm or more. Moreover, it is preferable from the same standpoint that the average particle size of the metal oxide particle be 50 μm or less, more preferably 30 μm or less, and further more preferably 20 μm or less.

It is preferable from the standpoint of allowing carrier transfer to become favorable that the full width at half maximum in the X-ray analysis of the metal oxide particle be 2 degrees or less, and more preferably 1 degree or less.

It is preferable that the content of the inorganic semiconductor particle contained in the application liquid for forming a semiconductor film be 0.5% by mass or more, more preferably 1% by mass or more, and further more preferably 1.5% by mass or more. Moreover, it is preferable from the standpoint of dispersibility of the inorganic semiconductor particle that the content of the inorganic semiconductor particle be 70% by mass or less, more preferably 50% by mass, and further more preferably 40% by mass.

(Compound Having Relative Permittivity of 2 or More)

The relative permittivity means a value measured by an impedance method setting a measurement frequency to 1 kHz and a measurement temperature to 23° C. A preferable range of the relative permittivity is 2 or more from the standpoint of photoelectric conversion efficiency, preferably 5 or more, and more preferably 10 or more. Moreover, it is preferable from the same standpoint that the relative permittivity be 5000 or less, more preferably 1500 or less, and further more preferably 200 or less.

In addition, the photoelectric conversion efficiency η can be determined by the following formula.

$$\eta = (\text{output of solar cell})/100 \times 100$$

$$\text{Output of solar cell} = \text{short-circuit current density} \times \text{open-circuit voltage} \times FF = V\text{max} \cdot I\text{max}$$

(Imax is a current when the output of the solar cell becomes maximum, and Vmax is a voltage when the output of the solar cell becomes maximum.)

The compounds having a relative permittivity of 2 or more are roughly classified into organic compounds and inorganic compounds.

The organic compounds include, as general resins, polyvinylidene chloride, polyvinylidene fluoride (PVDF), acrylic resins, acetyl cellulose, aniline resins, ABS resins, ebonite, vinyl chloride resins, acrylonitrile resins, aniline formaldehyde resins, aminoalkyl resins, urethanes, AS resins, epoxy resins, vinyl butyral resins, 3-fluorinated ethylene resins, silicon resins, vinyl acetate resins, styrene butadiene rubber, silicon rubber, cellulose acetates, styrene resins, dextrin, nylon, soft vinyl butyral resins, fluororesins, furfural resins, polyamides, polyester resins, polycarbonate resins, phenol resins, furan resins, polyacetal resins, melamine resins, urea resins, polysulfide polymers, polyethylenes, and so on. The organic compounds also include acetone, methyl alcohol, isobutyl alcohol, ethyl alcohol, aniline, methyl isobutyl ketone, ethylene glycol, propylene glycol, polyethylene glycols, polypropylene glycols, glycerin, cresol glycol, diallyl phthalate, dextrin, pyranol, phenol, bakelite varnish, formalin, thioglycerol, chloropyrene, succinic acid, succinonitrile, nitrocellulose, ethyl cellulose, hydroxyethyl cellulose, starch, hydroxypropyl starch, pullulan, glycidol pullulan, polyvinyl alcohol, sucrose, sorbitol, cyano group-containing organic compounds, and so on.

In addition, the cyano group-containing organic compound is a compound in which one or more cyano groups are contained. More preferably, the cyano group-containing organic compound is a cyanoethyl group-containing organic compound. Specific examples of the cyano group-containing organic compound include cyanoethyl pullulan, cyanoethyl polyvinyl alcohol, cyanoethyl saccharose (cyanoethyl sucrose), cyanoethyl cellulose, cyanoethyl hydroxyethyl cellulose, cyanoethyl starch, cyanoethyl hydroxypropyl starch, cyanoethyl glycidol pullulan, cyanoethyl sorbitol.

Particularly in the case of the organic compound, an organic compound containing an atom or functional group having a high polarity is preferable because the dielectric constant is large. The dipole moment that is an index of polarity can be estimated from the sum of the bond moment. As an organic compound having a relative permittivity of 2 or more, a compound containing a substituent having a bond moment of 1.4 D (D=3.33564×10$^{-30}$ Cm) or more is preferable. As a substituent having a bond moment of 1.4 D or more, OH, CF, CCl, C=O, N=O, CN, and so on are present. The organic compounds containing these substituents and having a relative permittivity of 2 or more include polyvinylidene fluoride (PVDF), glycerin, thioglycerol, and cyano group-containing organic compounds, and so on.

The inorganic compounds include calcium silicate, glass, aluminum oxide, zinc oxide, titanium oxide, selenium, barium titanate, bismuth silicate, lead niobate, titanium dioxide, urea, bakelite, Pyrex (R), vaseline, mica, copper chloride, copper oxide, copper sulfate, iron oxide, potassium chlorate, potassium chloride, sodium chloride, silver chloride, potassium bromide, lithium fluoride, silicon oxide, magnesium oxide, calcium fluoride, zinc sulfide, Ng, NaF, NaClO$_3$, NaSO$_4$, and so on.

As an inorganic compound, in addition to the above-described compounds, complex oxides such as lead zirconate titanate, barium titanate, strontium titanate, calcium titanate, and barium strontium titanate, or perovskite-type complex oxides or the like in which these complex oxides are used as a main component and, further, a Ba site is replaced with magnesium, a Ti site is replaced with tin and/or zirconium can also be used. Furthermore, compounds obtained by adding one or two or more trace amount of additives to the perovskite-type complex oxides can also be used.

Trace amount of additives include tungsten, tantalum, niobium, iron, copper, magnesium, bismuth, yttrium, molybdenum, vanadium, sodium, potassium, aluminum, manganese, nickel, zinc, calcium, strontium, silicon, tin, selenium, neodymium, erbium, thulium, hafnium, praseodymium, promethium, samarium, europium, gadolinium, terbium, dysprosium, lithium, scandium, barium, lanthanum, actinium, cerium, ruthenium, osmium, cobalt, palladium, silver, cadmium, boron, gallium, germanium, phosphorus, arsenic, antimony, fluorine, tellurium, lutetium, ytterbium, and so on.

As trace amount of additives, in addition to the above-described substances, there are ionic liquids or the like in which imidazolium, pyridium, pyrrolidinium, phosphonium, ammonium, sulfonium, or the like is a cation.

It is preferable from the standpoint of the stability of application liquid and the photoelectric conversion property that the content of the compound having a relative permittivity of 2 or more in the application liquid for forming a semiconductor film be 0.5% by mass or more, and more preferably 2% by mass or more. Moreover, it is preferable from the same standpoint that the content be 90% by mass or less, and more preferably 50% by mass or less.

(Compound Having Reducing Power Against Inorganic Semiconductor Particle)

The compound having reducing power against an inorganic semiconductor particle is a compound that, when mixed with the inorganic semiconductor particle, reduces the surface of the particle.

The compounds having reducing power against an inorganic semiconductor particle include 3-allyloxy-1,2-propanediol, 1,3-bis(allyloxy)-2-propanol, 2,3-dihydroxybenzaldehyde, catechol, dipentaerythritol, allitol, talitol, iditol, glycerolethoxylate, 1,4-dithioerythritol, 1,4-disulfanyl-2,3-butanediol, maltotriose, glycolic acid, lactic acid, polycarbonate diols, polyester polyols, glyceraldehyde, glycolaldehyde, invertose, m-erythritol, alkylene glycols, ethylene glycol, polyethylene glycols, propylene glycol, polypropylene glycols, butanediol, pentanediol, hexanediol, polyalkylene glycols, diethylene glycol, triethylene glycol, tetraethylene glycol, propylene glycol, ethoxyethanol, butanediol, ethylene glycol monoethyl ether, diethylene glycol monoethyl ether, diethylene glycol diethyl ether, octanediol, dodecanediol, glycerin, glyceraldehyde, 3-allyloxy-1,2-propandediol, thioglycerol, 1,5-pentanediol, 1,12-dodecanedioic acid, pyrocatechol, 3-methoxycatechol, 1,2,3-butanethiol, and so on; alcohols such as ethanol, methanol, isopropyl alcohol, and 2-ethylhexyl alcohol; and amine-based materials such as hexylamine, heptylamine, octylamine, undecylamine, tridecylamine, tetradecylamine, pentadecylamine, cetylamine, dibutylamine, diamylamine, cyclohexylamine, aniline, naphtylamine, and toluidine. Among the above-described compounds, glycerin and thioglycerol are particularly preferable.

It is preferable from the standpoint of the stability of application liquid and the photoelectric conversion property that the content of the compound having reducing power against an inorganic semiconductor particle in the application liquid for forming a semiconductor film be 0.5% by mass or more, and more preferably 2% by mass or more. Moreover, it is preferable from the same standpoint that the content be 90% by mass or less, and more preferably 50% by mass or less.

When the application liquid for forming a semiconductor film comprises both of the compound having reducing power against an inorganic semiconductor particle and the aforementioned compound having a relative permittivity of 2 or more, it is preferable from the standpoint of the stability of application liquid and the photoelectric conversion property that the total content of both compounds be 0.5% by mass or more, and more preferably 2% by mass or more. Moreover, it is preferable from the same standpoint that the total content of both compounds be 90% by mass or less, and more preferably 50% by mass or less. In addition, in the present embodiments, a compound having a relative permittivity of 2 or more and having reducing power against an inorganic semiconductor particle is a particularly preferable compound. Such compounds include glycerin and thioglycerol.

(Dispersant)

The application liquid for forming a semiconductor film may comprise a dispersant from the standpoint of adjusting the viscosity of application liquid for forming a semiconductor film.

Examples of the dispersant include alcohols such as methanol, ethanol, propanol, butanol, and hexanol; glycols such as ethylene glycol and propylene glycol; cellosolves such as cellosolve, ethylcellosolve, and butylcellosolve; ketones such as acetone and methyl ethyl ketone; esters such as ethyl acetate, and butyl acetate; ethers such as dioxane and tetrahydrofuran; amides such as N,N-dimethyl formamide; hydrocarbons such as benzene, toluene, xylene, trimethylbenzene, hexane, heptane, octane, nonane, decane, cyclohexane, decahydronaphthalene (decalin), and tetralin; and water.

It is preferable from the standpoint of adjusting the viscosity to make the application liquid for forming a semiconductor film easy to handle that the content of the dispersant contained in the application liquid for forming a semiconductor film be 1% by mass or more and 98.5% by mass or less.

When the compound having a relative permittivity of 2 or more or the compound having reducing power against an inorganic semiconductor particle is liquid, the compound itself also functions as a dispersant. In this case, the viscosity can be adjusted without further adding a dispersant.

(Surfactant)

A surfactant may be added to the application liquid for forming a semiconductor film for the purpose of improving dispersion stability. It is preferable from the standpoint of dispersion stability that the addition amount of the surfactant be 0.0001% by mass or more and 10% by mass or less.

The surfactant is not particularly limited, and, for example, an anionic surfactants, nonionic surfactants, cationic surfactants, amphoteric surfactants, and polymer surfactants can be used.

Examples of the above-described surfactants include:

anionic surfactants such as fatty acid salts including sodium lauryl sulfate, sulfuric acid ester salts of higher alcohols, alkyl benzene sulfonate including sodium dodecylbenzenesulfonate, polyoxyethylene alkyl ether sulfonates, polyoxyethylene polycyclic phenyl ether sulfates, polyoxynonylphenyl ether sulfonates, polyoxyethylene-polyoxypropylene glycol ether sulfonates, so-called reactive surfactants each having a sulfonic or sulfate group and a polymerizable unsaturated double bond in the molecule;

nonionic surfactants such as polyoxyethylene alkyl ethers, polyoxyethylene alkylphenyl ethers, sorbitan fatty acid esters, polyoxyethylene fatty acid esters, polyoxyethylene-polyoxypropylene block copolymers, reactive nonionic surfactants having a polymerizable unsaturated double bond in the molecule of these "polyoxyethylene alkyl ethers, polyoxyethylene alkylphenyl ethers, sorbitan fatty acid esters, or polyoxyethylene fatty acid esters";

cationic surfactants such as alkyl amine salts, quaternary ammonium salts;

(modified) polyvinyl alcohols; and straight chain alkyl thiols.

(Semiconductor film)

The semiconductor film of the present embodiments is a semiconductor film comprising an inorganic semiconductor particle and a compound having a relative permittivity of 2 or more or a compound having reducing power against the inorganic semiconductor particle. Semiconductor films of the present embodiments include a p-type semiconductor film, an n-type semiconductor film, and a semiconductor film having both properties of a p-type property and an n-type property in one film.

It is preferable that the semiconductor film be formed from the application liquid for forming a semiconductor film.

It is preferable from the standpoint of the photoelectric conversion property when the semiconductor film is used for making a solar cell that the content of the inorganic semiconductor particle in the semiconductor film be 20% by mass or more, and more preferably 50% by mass or more. Moreover, it is preferable from the same standpoint that the content be 99.5% by mass or less, and more preferably 99% by mass or less.

It is preferable from the standpoint of the photoelectric conversion property that the content of the compound having a relative permittivity of 2 or more or the compound having reducing power against an inorganic semiconductor particle be 0.5% by mass or more, and more preferably 1% by mass or more. Moreover, it is preferable from the same standpoint that the content be 80% by mass or less, and more preferably 50% by mass or less. Moreover, when the semiconductor film comprises both of the compound having a relative permittivity of 2 or more and the compound having reducing power against an inorganic semiconductor particle, it is preferable that the total content of both compounds in the semiconductor film be 0.5% by mass or more, and more preferably 1% by mass or more. Moreover, the total content of both compounds be 80% by mass or less, and more preferably 50% by mass or less. Moreover, it is preferable from the standpoint of the photoelectric conversion property that the film thickness of the semiconductor film be 0.1 µm or more, and more preferably 0.5 µm or more. Moreover, it is preferable from the same standpoint that the film thickness be 1000 µm or less, and more preferably 500 µm or less. The film thickness of the semiconductor film is measured by a cross section SEM or a cross section TEM observation.

It is considered that the compound having a relative permittivity of 2 or more or the compound having reducing power against an inorganic semiconductor particle in the semiconductor film functions as a binder for the inorganic semiconductor particle. It is preferable that such a compound be a compound having a relative permittivity of 2 or more and having reducing power against an inorganic semiconductor particle.

With respect to the inorganic semiconductor particle contained in the semiconductor film, two or more of the p-type semiconductor particles listed above may be used together, two or more of the n-type semiconductor particles listed above may be used together, or both of the p-type semiconductor particle and the n-type semiconductor particle may be used together.

The content of the compound having reducing power against an inorganic semiconductor particle in the semiconductor film here includes the content of a compound in a state where the compound having reducing power is oxidized as a result of reduction of the inorganic semiconductor particle by the compound having reducing power.

Specifically, description is made taking glycerin as an example of the compounds having reducing power against an inorganic semiconductor particle. When glycerin shown in the following chemical formula (1) and a silicon particle are mixed and a thin film is manufactured, the surface of the silicon particle is reduced to partially form Si—H bonds. On the other hand, it is estimated that glycerin is oxidized to generate compounds described in the following chemical formulas (2) to (13).

[Chemical Formula 1]

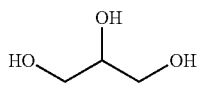
(1)

[Chemical Formula 2]

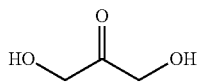
(2)

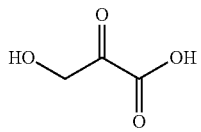
(3)

(4)

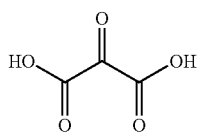
(5)

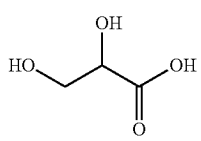
(6)

(7)

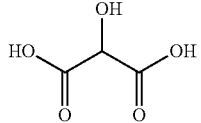
(8)

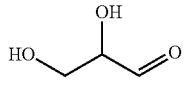
(9)

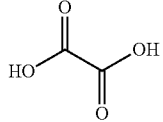
(10)

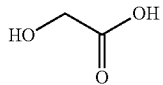

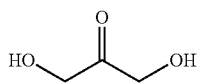

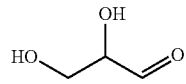
(11)

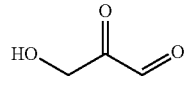
(12)

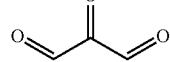
(13)

This can be confirmed from an IR spectrum of the semiconductor film. A peak attributable to stretching vibration of a C=O bond cannot be observed; however, when a semiconductor film is formed through a heating process, the peak attributable to the C=O stretching vibration can be observed for the application liquid for forming a semiconductor film, but the whole glycerin is not oxidized and some glycerin is left unoxidized.

An oxidation rate of glycerin can be determined from the following formula (I).

$$\text{Oxidation rate of glycerin} = \alpha CO/(\alpha CO + \alpha OH) \quad (I)$$

In the formula (I), $\alpha OH$ denotes peak strength derived from an OH bond in glycerin around 3350 cm$^{-1}$, and $\alpha CO$ denotes peak strength derived from a CO bond in a compound produced by oxidation of glycerin around 2350 cm$^{-1}$.

It is preferable from the standpoint of removing an oxidized layer on the surface of the inorganic semiconductor particle that the oxidation rate of glycerin be 0.09 or more and less than 1. The range is also the same when the silicon particle is replaced with a compound semiconductor particle. Moreover, the range is also the same when the silicon particle is replaced with a metal oxide.

It can also be confirmed from the IR spectrum of the semiconductor film that the surface of the silicon particle is reduced to partially form Si—H bonds. A reduction rate of the silicon particle can be determined from the following formula (II).

$$\text{Reduction rate of silicon particle} = \beta SiH/(\beta SiH + \beta SiOSi) \quad (II)$$

In the formula (II), $\beta SiH$ denotes peak strength derived from an SiH bond around 2100 cm$^{-1}$, and $\beta SiOSi$ denotes peak strength derived from an SiOSi bond around 1100 cm$^{-1}$.

It is preferable from the standpoint of removing an oxidized layer on the surface of the silicon particle that the reduction rate of the silicon particle be 0.01 or more and 0.5 or less.

Accordingly, in one embodiment, glycerin and oxides of glycerin are present in a semiconductor film produced using glycerin as a compound having a relative permittivity of 2 or more or a compound having reducing power against an inorganic semiconductor particle. In this case, the content of glycerin in the semiconductor film is defined as the total content of glycerin and compounds produced by oxidation of glycerin.

In addition, the oxidation rate of the compound having reducing power against an inorganic semiconductor particle can generally be determined by the following formula (III).

$$\text{Oxidation rate of a compound having reducing power against inorganic semiconductor particle} = \alpha'Y/(\alpha'X + \alpha'Y) \quad (III)$$

In the formula (III), α'X denotes peak strength derived from a functional group which reacts in oxidation reaction of the compound, and α'Y denotes peak strength derived from a functional group produced by oxidation of the compound.

(Method for Producing Semiconductor Film)

The present embodiment provides a method for producing a semiconductor film, the method comprising a step of obtaining an applied film by applying the application liquid for forming a semiconductor film to a substrate on which an electrode is formed. In addition, when the application liquid for forming a semiconductor film comprises a dispersant, it is preferable that the method for producing a semiconductor film of the present embodiment comprise a step of obtaining an applied film by applying the application liquid to a substrate on which an electrode is formed and a step of heating the applied film at 20 to 500° C. Namely, with respect to the semiconductor film of the present embodiments, it is preferable to remove the dispersant added for the purpose of adjusting viscosity from the application liquid for forming a semiconductor film. The dispersant here is, as described previously, different from the compound having a relative permittivity of 2 or more.

Substrates to which the application liquid for forming a semiconductor film is to be applied in order to manufacture the semiconductor film include every kind of substrates such as: a glass substrate; a substrate of plastics such as PET (polyethylene terephthalate), PC (polycarbonate), PEN (polyethylene naphthalate), PES (polyether sulfone), PI (polyimide), PP (polypropylene), and acrylic resins; a metal substrate such as an aluminum substrate and a stainless steel (SUS) substrate; and a paper substrate.

As a method for applying the application liquid for forming a semiconductor film, methods such as a casting method, a spin coating method, an inkjet method, an dipping method, and a spraying method; and printing methods such as a flexographic printing, a gravure printing, and a screen printing methods can be used.

When the application liquid comprises a dispersant in the method for producing a semiconductor film using the application liquid for forming a semiconductor film, removal of the dispersant and fusion among inorganic semiconductor particles can be promoted by the step of heating the application liquid at 20 to 500° C. It is preferable from the standpoint of removal of the dispersant and operating efficiency that the heating temperature be 40° C. or more, and more preferably 60° C. or more. Moreover, it is preferable from the same standpoint that the heating temperature be 400° C. or less, and more preferably 250° C. or less. With respect to the heating step, when the boiling point of the dispersant is low, the heating temperature can be set to be low because the dispersant can only be removed in the heating step. In this case, the substrate is not required to have heat resistance, and therefore it becomes possible to select a material for the substrate from a wide range of resin materials. Since general purpose resins such as acrylic resins, PP, PET, and PC can be used as a resin material, a solar cell can be produced at low cost. In addition, when the dispersant is not used, the heating step does not have to be included.

(Semiconductor Element)

The semiconductor element of the present embodiments is an element comprising: a semiconductor layer, a layer comprising a semiconductor film or a semiconductor layer and a layer comprising a semiconductor film. The specific examples thereof are shown by a light-emitting diode, a semiconductor laser, a photodiode, and a solar cell. The semiconductor element of the present embodiments comprises a junction interface layer or the like as will be described later. It is preferable that the semiconductor element be a solar cell. The present embodiments will be described below taking a solar cell as an example.

(Solar Cell)

The solar cell of the present invention is a cell comprising: a semiconductor layer or a layer comprising a semiconductor film; or a semiconductor layer and a layer comprising a semiconductor film; an electrode; and a substrate, in which power is generated by light. A semiconductor that constitutes the solar cell may be a p-p junction type or an n-n junction type; however, a p-n junction type is preferable.

The constitution of the solar cell of the present embodiments is described. With respect to the solar cell, a solar cell having a pn junction-type semiconductor layer, the solar cell comprising: a p-type semiconductor layer or a layer comprising a p-type semiconductor film of the present embodiments; and an n-type semiconductor layer or a layer comprising an n-type semiconductor film of the present embodiments as constituent elements, is general.

The layer comprising a p-type semiconductor film is a layer formed from the aforementioned application liquid for forming a semiconductor film and is preferable to comprise at least one of the silicon particle and the compound semiconductor particle, and more preferably the silicon particle. The layer comprising an n-type semiconductor film is a layer formed from the aforementioned application liquid for forming a semiconductor film and is preferable to comprise at least one of the silicon particle and the metal oxide particle. The p type in the case where the carrier of charge transfer in the semiconductor is a hole. The n type is the case where the carrier of charge transfer in the semiconductor is a conduction electron. The semiconductor layer apparently has a positive or negative charge by the carrier of charge transfer being the hole or the conductive electron, respectively.

It is preferable that the inorganic semiconductor particle make contact with an electrode in efficiently taking electrons and holes out to the electrode. Namely, it is preferable that the inorganic semiconductor particle contained in the layer comprising the semiconductor film of the present embodiments making contact with the electrode make contact with the electrode and thereby the electrode be covered with the inorganic semiconductor particle. However, the whole surface of the electrode does not have to be covered with the inorganic semiconductor particle. In addition, it is preferable from the standpoint of power generation efficiency that the inorganic semiconductor particle cover 30% or more of the electrode, and more preferably 50% or more. The extent of contact, namely, the extent of covering, can be observed and evaluated by, for example, an optical microscope or an electron microscope.

The thickness between electrodes of the solar cell of the present embodiments is determined depending on semiconductors to be used. A solar cell that has plasticity and is capable of enduring deformation to some extent is obtained by making the thickness between electrodes as thin as 1000 μm or less.

Particularly when the inorganic semiconductor particle is used, stress generated when the solar cell is bent can be mitigated among particles. Accordingly, it is preferable to use the inorganic semiconductor particle when the solar cell having plasticity is manufactured.

It is preferable that the solar cell of the present embodiments have plasticity and be a flexible solar cell. The flexible solar cell means a solar cell that is capable of generating power even after the following steps (a) to (d).

(a) Place a solar cell on a horizontal stand.

(b) Hold a half of an area of the solar cell, and bend the solar cell until an angle between the stand and the solar cell becomes 45 degrees. Thereafter, return the solar cell to its original state.

(c) Repeat the step (b) 5 times.

(d) Confirm whether the solar cell can generate power or not.

Since the flexible solar cell of the present invention can be wound up during production, it becomes possible to improve production speed and achieve cost reduction.

Moreover, it is preferable that an electrode substrate of the present embodiments have plasticity and is a flexible electrode substrate. The electrode substrate denotes a substrate comprising: an electrode; a semiconductor layer; and a junction interface layer, or a substrate comprising: an electrode; and a layer comprising a semiconductor film. In addition, details of the junction interface layer will be described later.

The flexible electrode substrate means an electrode substrate that is capable of generating power even after the following steps (a) to (e).

(a) Place an electrode substrate on a horizontal stand.

(b) Hold a half of an area of the electrode substrate, and bend the electrode substrate until an angle between the stand and the electrode substrate becomes 45 degrees. Thereafter, return the electrode substrate to its original state.

(c) Repeat the step (b) 5 times.

(d) Manufacture a solar cell by sticking a semiconductor layer or film to the electrode substrate.

(e) Confirm whether the solar cell can generate power or not.

Particularly when the junction interface layer is made of an organic compound, occurrence of peeling or cracks of the inorganic semiconductor particles is suppressed because the semiconductor layer is covered with the junction interface layer. Moreover, the layer comprising a semiconductor film is contained in the electrode substrate to thereby suppress the occurrence of peeling or cracks of the inorganic semiconductor particle, which is preferable.

Figure 7:
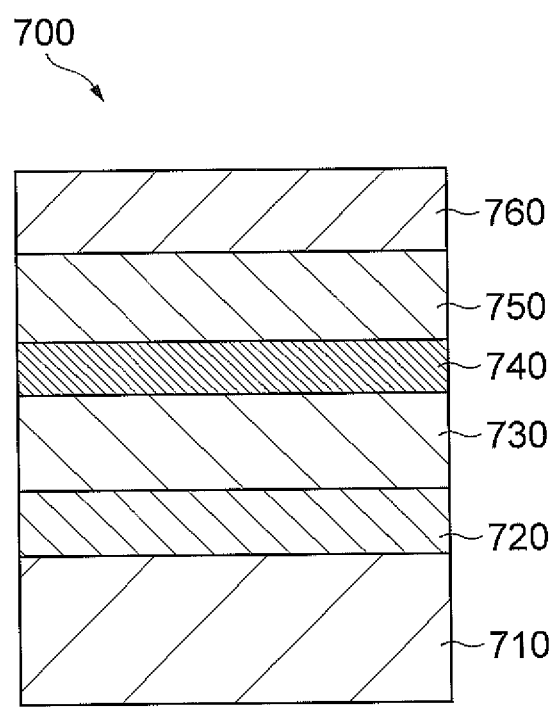
FIG. 7 is a sectional view illustrating an embodiment of a solar cell of the present invention.
Figure 8:
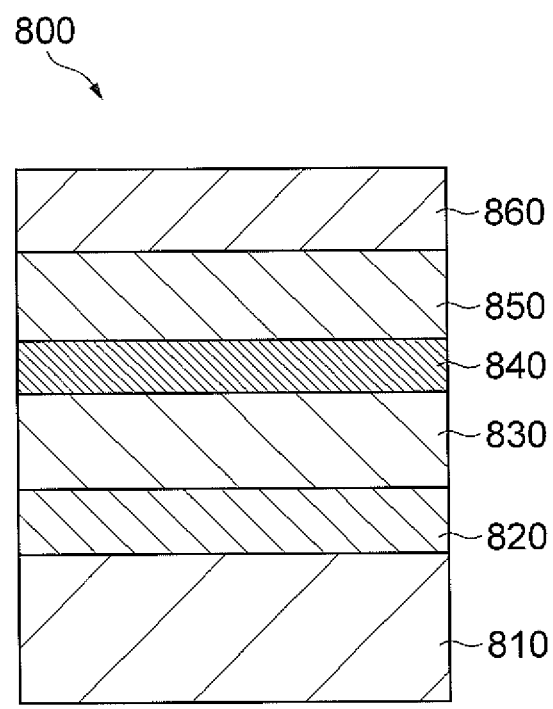
FIG. 8 is a sectional view illustrating an embodiment of a solar cell of the present invention.
Figure 9:
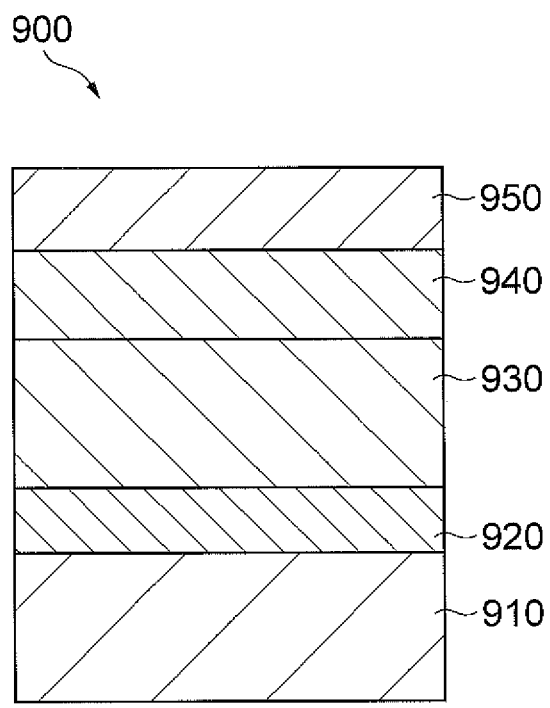
FIG. 9 is a sectional view illustrating a general embodiment of a solar cell.

As specific examples of the solar cell, examples of the solar cell of the present embodiments are shown in FIGS. 1 to 8 and an example of a solar cell having a general pn junction is shown in FIG. 9.

As example 1, a solar cell 100 illustrated in FIG. 1 comprises: a positive electrode layer 120; a layer 130 comprising the semiconductor film of the present embodiments; an n-type semiconductor layer 140; and a negative electrode layer 150 on a substrate 110. It is also possible to further subdivide the respective layers to provide a plurality of layers. For example, an electron extraction layer (not illustrated in the figure) can also be provided between the layer 140 and the layer 150. Moreover, a hole extraction layer (not illustrated in the figure) can also be provided between the layer 130 and the layer 120. Moreover, a light-absorbing layer (not illustrated in the figure) can also be provided between the layer 130 and the layer 140 separately from the layer comprising the semiconductor film of the present embodiments. Moreover, the layer 130 and the layer 140 may become a bulk hetero structure in which both layers are mixed with each other. It is preferable that either the layer 120 or the layer 150 be transparent. Moreover, the substrate 110 may be present on the side of the layer 150 or on both sides of the layer 120 and the layer 150. An aspect of example 1 is, namely, a solar cell comprising: a layer comprising the semiconductor film of the present embodiments; and another semiconductor layer having an opposite charge to the semiconductor film.

In addition, the "semiconductor layer" is different from the "semiconductor film (layer comprising the semiconductor film)" in the present embodiments. The semiconductor film is, as described above, a semiconductor film comprising: an inorganic semiconductor particle; and a compound having a relative permittivity of 2 or more or a compound having reducing power against the inorganic semiconductor particle. On the other hand, the semiconductor layer is formed from a semiconductor such as a silicon wafer, an inorganic semiconductor layer, or an organic semiconductor layer. Namely, the semiconductor layer means: a silicon wafer obtained by slice-cutting a silicon ingot; a silicon wafer obtained by polishing the above-described silicon wafer; an inorganic semiconductor layer formed, on a substrate, from an inorganic semiconductor material using a vacuum apparatus with a vapor deposition method, a CVD method, a sputtering method, or the like; an organic semiconductor layer formed from an organic semiconductor material using an application method or a vapor deposition method; or the like.

Specifically, examples of the p-type semiconductor layers include a monocrystalline or polycrystalline silicon wafer; an amorphous silicon film; a compound semiconductor layer such as CIGS-based or CZTS-based compound semiconductor layer; a layer comprising a metal oxide particle such as copper (I) oxide or a silicon particle; a layer comprising a compound semiconductor particle such as CIGS-based or CZTS-based compound semiconductor particle; and a layer comprising a p-type organic semiconductor. The p-type organic semiconductors include: pentacene, pentacene derivatives such as 6,13-bis(triisopropylsilylethynyl)pentacene, tetracene, tetracene derivatives such as 2-hexyl tetracene, and aromatic amine-based materials such as N,N-diphenyl-N,N'-bis(1-naphtyl)-1,1'-biphenyl-4,4'-diamine (NPD), N,N'-diphenyl-N,N'-bis(3-methylphenyl)-1,1'-biphenyl-4,4'-diamine (TPD), and 1,3,5-tris(3-methyldiphenylamino)benzene (m-MTDATA). Moreover, the p-type organic semiconductors include, in addition to the above-described p-type organic semiconductors, phthalocyanine-based complexes such as copper phthalocyanine (CuPc) and zinc phthalocyanine (ZnPc), porphyrin-based compounds, perylene-based derivatives, imidazole derivatives, triazole derivatives, pyrazoline derivatives, oxazole derivatives, oxadiazole derivatives, stilbene derivatives, polyaryl alkane derivatives, and so on. The p-type organic semiconductors further include derivatives of thiophene and derivatives of polyphenyl vinylene (PPV), and so on. Derivatives of thiophene specifically include P3HT (Poly(3-hexylthiophene-2,5-diyl)), P3OT (Poly(3-octylthiophene-2,5-diyl)), P3 DDT (Poly(3-dodecylthiophene-2,5-diyl)), and so on. A monocrystalline or polycrystalline silicon wafer is preferable as a p-type semiconductor layer from the standpoint of carrier transfer and costs.

Examples of the n-type semiconductor layer include: a monocrystalline or polycrystalline silicon wafer; an amorphous silicon film; a layer comprising a metal oxide such as titanium oxide and zinc oxide; a layer comprising a metal oxide particle such as a silicon particle, a titanium oxide particle and a zinc oxide particle; and a layer comprising an n-type organic semiconductor. The n-type organic semiconductors include fluorinated acene-based compounds, fullerene-based compounds such as fullerene, 60PCBM ([6,6]-

Phenyl C$_{61}$ butyric acid methyl ester) and 70PCBM ([6,6]-Phenyl C$_{71}$ butyric acid methyl ester), naphthalene derivatives, anthracene derivatives, phenanthrene derivatives, pyrene derivatives, perylene derivatives, perylene tetracarboxylic acid diimide derivatives, oxadiazole derivatives, triazole derivatives, triazine derivatives, quinoline derivatives. A monocrystalline or polycrystalline silicon wafer and a layer comprising a metal oxide or metal oxide particle are preferable as an n-type semiconductor layer from the standpoint of carrier transfer and costs.

When the p-type semiconductor layer or the n-type semiconductor layer is a silicon wafer, it is preferable the thickness of the silicon wafer be 50 μm or more. Moreover, the thickness of the silicon wafer is preferably 1000 μm or less, more preferably 700 μm or less, and further more preferably 300 μm or less. In the case of the amorphous silicon film, it is preferable that the thickness be 0.1 μm or more and 100 μm or less. In the case of the compound semiconductor layer, it is preferable that the thickness be 0.5 μm or more and 10 μm or less. In the case of a film obtained by solidifying the silicon particle, it is preferable that the thickness be 0.5 μm or more. Moreover, it is preferable that the thickness be 500 μm or less, and more preferably 300 μm or less. In the case of a film obtained by solidifying the compound semiconductor particle, it is preferable that the thickness be 0.5 μm or more and 10 μm or less. In the case of a film comprising the organic semiconductor, it is preferable that the thickness be 10 nm or more and 10 μm or less. Moreover, in the case of adopting a semiconductor layer formed from a plurality of inorganic semiconductor particles, namely, in the case of forming a semiconductor layer in a film state from a plurality of inorganic semiconductor particles, it is preferable from the relationship between light-absorbing capability and carrier transport that the thickness be 0.01 μm or more and 300 μm or less.

The film thickness of the semiconductor layer is measured by vertscan 2.0 (manufactured by Ryoka Systems Inc.) or cross section TEM observation.

In addition, when the n-type semiconductor layer is a layer comprising a metal oxide such as titanium oxide or zinc oxide or a metal oxide particle, it is preferable from the relationship between leak prevention and carrier transport that the thickness of the layer be 0.1 μm or more, and more preferably 0.2 μm or more. Moreover, it is preferable from the same standpoint that the thickness be 10 μm or less, and more preferably 5 μm or less.

In addition, examples of the method for forming a semiconductor layer in a film state from a plurality of inorganic semiconductor particles include: a method in which a plurality of materials are subjected to co-vapor deposition and are deposited on a substrate with an electrode; and a method in which a coating liquid comprising a plurality of materials are prepared and then a semiconductor layer is manufactured by various kinds of printing methods using the coating liquid.

Figure 2:
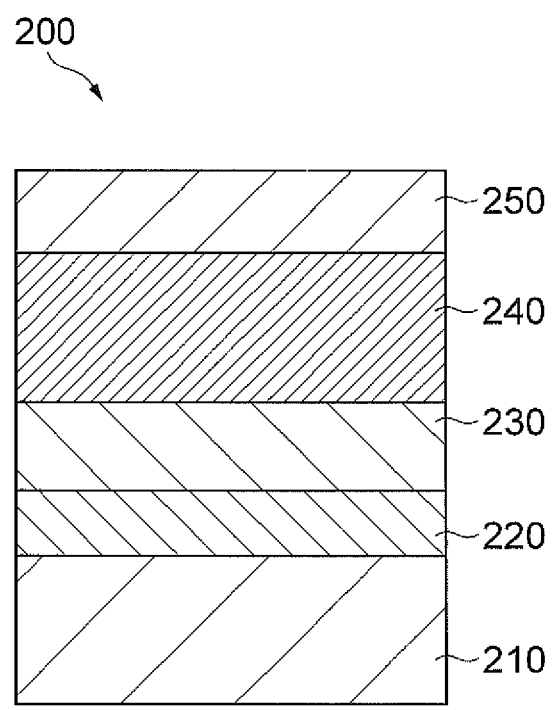
FIG. 2 is a sectional view illustrating an embodiment of a solar cell of the present invention.

As example 2, a solar cell 200 illustrated in FIG. 2 comprises: a positive electrode layer 220; a p-type semiconductor layer 230; a layer 240 comprising the semiconductor film of the present embodiments; and a negative electrode layer 250 on a substrate 210. It is also possible to further subdivide the respective layers to provide a plurality of layers. For example, a hole extraction layer (not illustrated in the figure) can also be provided between the layer 230 and the layer 220. Moreover, an electron extraction layer (not illustrated in the figure) can also be provided between the layer 240 and the layer 250. Moreover, a light-absorbing layer (not illustrated in the figure) can also be provided between the layer 230 and the layer 240 separately from the layer comprising the semiconductor film of the present embodiments. Moreover, the layer 230 and the layer 240 may become a bulk hetero structure in which both layers are mixed with each other. It is preferable that either the layer 220 or the layer 250 be transparent. Moreover, the substrate 210 may be present on the side of the layer 250 or on both sides of the layer 220 and the layer 250.

Figure 3:
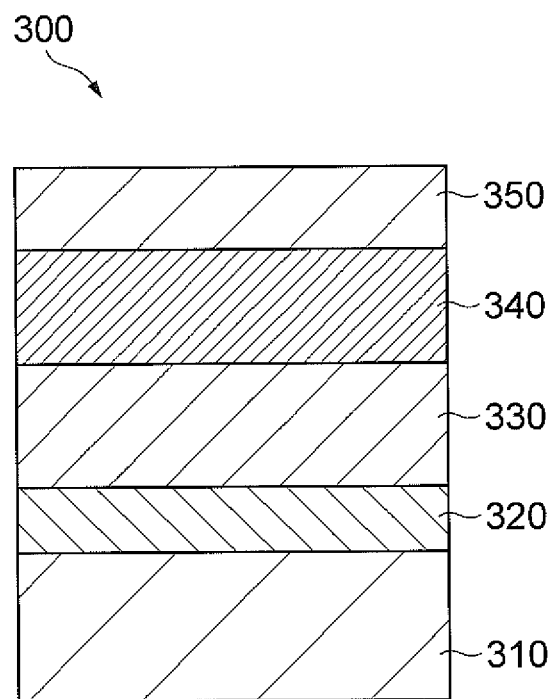
FIG. 3 is a sectional view illustrating an embodiment of a solar cell of the present invention.

As example 3, a solar cell 300 illustrated in FIG. 3 comprises: a positive electrode layer 320; a layer 330 comprising the p-type semiconductor film of the present embodiments; a layer 340 comprising the n-type semiconductor film of the present embodiments; and a negative electrode layer 350 on a substrate 310. It is also possible to further subdivide the respective layers to provide a plurality of layers. For example, a hole extraction layer (not illustrated in the figure) can also be provided between the layer 330 and the layer 320. Moreover, an electron extraction layer (not illustrated in the figure) can also be provided between the layer 340 and the layer 350. Moreover, a light-absorbing layer (not illustrated in the figure) can also be provided between the layer 330 and the layer 340 separately from the layer comprising the semiconductor film of the present embodiments. Moreover, the layer 330 and the layer 340 may become a bulk hetero structure in which both layers are mixed with each other. It is preferable that either the layer 320 or the layer 350 be transparent. Moreover, the substrate 310 may be present on the side of the layer 350 or on both sides of the layer 320 and the layer 350. An aspect of example 3 is, namely, a solar cell comprising: a layer comprising the semiconductor film of the present embodiments; and another semiconductor film having an opposite charge to a charge of the semiconductor film.

Figure 4:
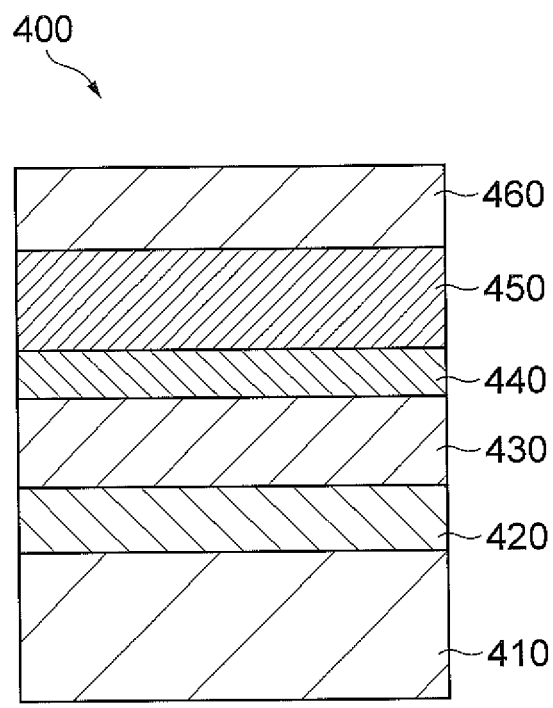
FIG. 4 is a sectional view illustrating an embodiment of a solar cell of the present invention.

As example 4, a solar cell 400 illustrated in FIG. 4 comprises: a positive electrode layer 420; a layer 430 comprising the p-type semiconductor film of the present embodiments; a junction interface layer 440 comprising a compound having a relative permittivity of 2 or more; a layer 450 comprising the n-type semiconductor film of the present embodiments; and a negative electrode layer 460 on a substrate 410. It is also possible to further subdivide the respective layers to provide a plurality of layers. For example, a hole extraction layer (not illustrated in the figure) can also be provided between the layer 430 and the layer 420. Moreover, an electron extraction layer (not illustrated in the figure) can also be provided between the layer 450 and the layer 460. It is preferable that either the layer 420 or the layer 460 be transparent. Moreover, the substrate 410 may be present on the side of the layer 460 or on both sides of the layer 420 and the layer 460. An aspect of example 4 is, namely, a solar cell comprising: a layer comprising the semiconductor film of the present embodiments; a layer comprising another semiconductor film having an opposite charge to a charge of the semiconductor film; and a junction interface layer comprising a compound having a relative permittivity of 2 or more between the layer comprising the semiconductor film of the present embodiments and the layer comprising the another semiconductor film.

Figure 5:
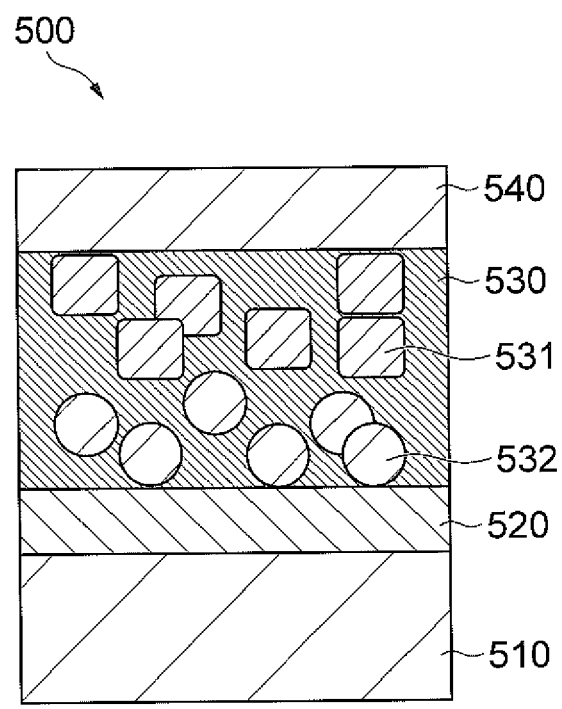
FIG. 5 is a sectional view illustrating an embodiment of a solar cell of the present invention.

As example 5, a solar cell 500 illustrated in FIG. 5 comprises: a positive electrode layer 520; a layer 530 comprising the semiconductor film of the present embodiments, the layer comprising a p-type semiconductor particle 531, an n-type semiconductor particle 532, and a compound having a relative permittivity of 2 or more; and a negative electrode layer 540 on a substrate 510. In addition, the substrate 510 may be present on the side of the layer 540 or on both sides of the layer 520 and the layer 540. It is preferable that either the layer 520 or the layer 540 be transparent. Moreover, an electron extraction layer (not illustrated in the figure) can also be provided between the layer 530 and the layer 540. A hole extraction layer (not illustrated in the figure) can also be provided between the layer 530 and the layer 520. It is preferable from the standpoint of light absorbing capability and carrier transport that the average particle size of the p-type semiconductor particles and the n-type semiconductor particles be 5 nm or more, and more preferably 10 nm or more. Moreover, it is preferable from the same standpoint that the average particle size be 200 μm or less, and more preferably 100 μm or less. Moreover, it is preferable for the purpose of exhibiting a high photoelectric conversion efficiency that the thickness of the layer 530 be 100 nm or more, and more preferably 500 nm or more. Moreover, it is preferable from the same standpoint that the thickness be 1000 μm or less, and more preferably 500 μm or less. The layer 530 is an example in which the p-type semiconductor particle and the n-type semiconductor particle are contained in the same layer and make contact with each other to thereby realize P/N junction in one layer.

Figure 6:
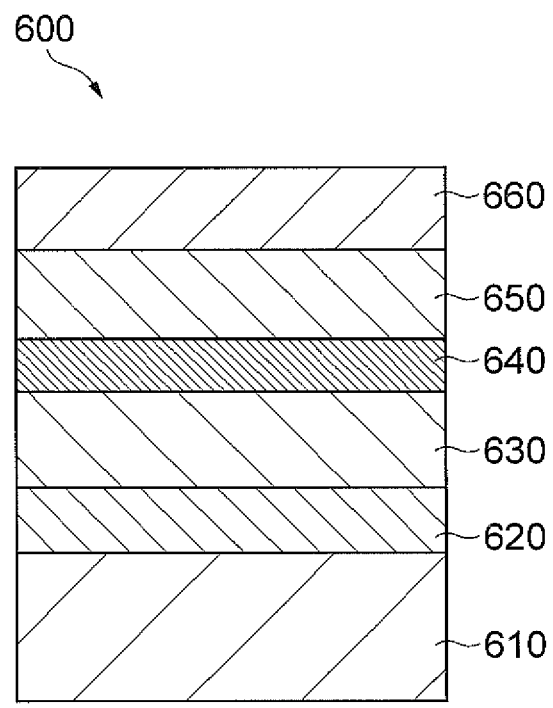
FIG. 6 is a sectional view illustrating an embodiment of a solar cell of the present invention.

As example 6, a solar cell 600 illustrated in FIG. 6 comprises: a positive electrode layer 620; a p-type semiconductor layer 630; a junction interface layer 640 comprising a compound having a relative permittivity of 2 or more; an n-type semiconductor layer 650; and a negative electrode layer 660 on a substrate 610. In addition, the substrate 610 may be present on the side of the layer 660 or on both sides of the layer 620 and the layer 660. It is preferable that either the layer 620 or the layer 660 be transparent. Moreover, an electron extraction layer (not illustrated in the figure) can also be provided between the layer 650 and the layer 660. A hole extraction layer (not illustrated in the figure) can also be provided between the layer 630 and the layer 620.

In addition, an aspect of example 6 is a solar cell comprising: a first semiconductor layer; a second semiconductor layer; and a junction interface layer comprising a compound having a relative permittivity of 2 or more between the first semiconductor layer and the second semiconductor layer. As described above, a solar cell in which the first semiconductor layer is a p-type semiconductor layer and the second semiconductor layer is an n-type semiconductor layer is made possible. In addition, it is preferable that at least one of the semiconductor layers be a titanium oxide layer, a silicon wafer, or a compound semiconductor layer.

As example 7, a solar cell 700 illustrated in FIG. 7 comprises: a positive electrode layer 720; a layer 730 comprising the semiconductor film of the present embodiments; a junction interface layer 740 comprising a compound having a relative permittivity of 2 or more; an n-type semiconductor layer 750; and a negative electrode layer 760 on a substrate 710. In addition, the substrate 710 may be present on the side of the layer 760 or on both sides of the layer 720 and the layer 760. It is preferable that either the layer 720 or the layer 760 be transparent. Moreover, an electron extraction layer (not illustrated in the figure) can also be provided between the layer 750 and the layer 760. A hole extraction layer (not illustrated in the figure) can also be provided between the layer 730 and the layer 720. It is preferable that the layer 703 be a layer comprising a p-type semiconductor film.

As example 8, a solar cell 800 illustrated in FIG. 8 comprises: a positive electrode layer 820; a p-type semiconductor layer 830; a junction interface layer 840 comprising a compound having a relative permittivity of 2 or more; a layer 850 comprising the semiconductor film of the present embodiments; and a negative electrode layer 860 on a substrate 810. In addition, the substrate 810 may be present on the side of the layer 860 or on both sides of the layer 820 and the layer 860. It is preferable that either the layer 820 or the layer 860 be transparent. Moreover, an electron extraction layer (not illustrated in the figure) can also be provided between the layer 850 and the layer 860. A hole extraction layer (not illustrated in the figure) can also be provided between the layer 830 and the layer 820. It is preferable that the layer 850 be a layer comprising an n-type semiconductor film.

In addition, the aspects of examples 7 and 8 are a solar cell comprising: a layer comprising the semiconductor film of the present embodiments; a semiconductor layer; and a junction interface layer comprising a compound having a relative permittivity of 2 or more between the layer comprising a semiconductor film and the semiconductor layer. As described above, a solar cell in which the layer comprising a semiconductor film is a layer comprising a p-type semiconductor film and the semiconductor layer is an n-type semiconductor layer, or the layer comprising a semiconductor film is a layer comprising an n-type semiconductor film and the semiconductor layer is a p-type semiconductor layer is made possible.

As example 9, a solar cell 900 illustrated in FIG. 9 is an example of a general pn junction solar cell. The solar cell comprises: a positive electrode layer 920; a p-type semiconductor layer 930; an n-type semiconductor layer 940; and a negative electrode layer 950 on a substrate 910. In addition, the substrate 910 may be present on the side of the layer 950 or on both sides of the layer 920 and the layer 950. It is preferable that either the layer 920 or the layer 950 be transparent.

The constitution of the solar cell of the present embodiments may have a tandem structure in which two or more of the structures illustrated in the above-described FIGS. 1 to 8 and FIG. 9 are stacked in series.

As the above-described substrate, every kind of substrates that are usually used, such as: a glass substrate; a substrate of plastics such as PET (polyethylene terephthalate), PC (polycarbonate), and PP (polypropylene); an aluminum substrate; a stainless steel (SUS) substrate; and a paper substrate can be used.

As a negative electrode (or, negative electrode layer), metals or metal oxides that are usually used, such as aluminum, SUS, gold, silver, ITO (indium tin oxide), FTO (fluorine-doped tin oxide), IZO (indium zinc oxide), zinc oxide, and aluminum-doped zinc oxide can be used. Moreover, conductive polymers, graphenes, and so on can also be used.

As a positive electrode (or, positive electrode layer), metals or metal oxides that are usually used, such as aluminum, SUS, gold, silver, ITO (indium tin oxide), FTO (fluorine-doped tin oxide), IZO (indium zinc oxide), zinc oxide, and aluminum-doped zinc oxide can be used. Moreover, conductive polymers, graphenes, and so on can also be used.

In addition, the thicknesses of the substrate, the negative electrode, and the positive electrode are not particularly limited; however, the thicknesses can be set to about 0.1 mm to 100 mm, about 0.01 μm to 1000 μm, and about 0.01 μm to about 1000 μm, respectively.

(Junction Interface Layer)

A solar cell excellent in power generation efficiency can easily be manufactured by providing a junction interface layer comprising a compound having a relative permittivity of 2 or more at a junction interface of the semiconductor layer. Particularly, it is preferable to provide a junction interface layer comprising a compound having a relative permittivity of 2 or more at a junction interface of the p-type semiconductor layer and the n-type semiconductor layer, a junction interface of the p-type semiconductor film and the n-type semiconductor layer, a junction interface of the p-type semiconductor layer and the n-type semiconductor film, and a junction interface of the p-type semiconductor film and the n-type semiconductor film.

The compounds having a relative permittivity of 2 or more include the aforementioned compounds. Furthermore, it is preferable from the standpoint of plasticity, film production properties, or the like that the junction interface layer comprise an organic compound. It is preferable that the organic compound have OH, CF, CCl, C=O, N=O, CN, or the like as a substituent group. It is preferable that the specific organic compound be polyvinylidene fluoride (PVDF), glycerin, thioglycerol, or a cyano group-containing organic compound. The cyano group-containing organic compound means a compound in which one or more cyano groups are contained. It is more preferable that the cyano group-containing organic compound be a cyanoethyl group-containing organic compound. Specific examples of the cyano group-containing compound include cyanoethyl pullulan, cyanoethyl polyvinyl alcohols, cyanoethyl saccharose (cyanoethyl sucrose), cyanoethyl cellulose, cyanoethyl hydroxyethyl cellulose, cyanoethyl starch, cyanoethyl hydroxypropyl starch, cyanoethyl glycidol pullulan, cyanoethyl sorbitol.

A preferable range of the relative permittivity of the junction interface layer is 2 or more, more preferably 5 or more, and further more preferably 10 or more from the standpoint of photoelectric conversion efficiency. Moreover, it is preferable from the same standpoint that the relative permittivity be 5000 or less, more preferably 1500 or less, and further more preferably 200 or less.

It is preferable from the standpoint of photoelectric conversion efficiency that the content of the compound having a relative permittivity of 2 or more in the junction interface layer be 50% by mass or more, more preferably 80% by mass or more, further more preferably 90% by mass or more, and extremely preferably 95% by mass or more. On the other hand, it is preferable from the standpoint of improving solar cell properties that the upper limit of the content be 100% by mass, namely, it is preferable that the junction interface layer consist of the compound having a relative permittivity of 2 or more. It is preferable from the standpoint of performance of the solar cell that the junction interface layer be filled without containing air. The junction interface layer may comprise a general versatile resin as a binder component, further, a surfactant, a dispersant, and so on within a range without impairing the properties.

The junction interface layer does not have to be introduced over the whole face of the junction interface of the p-type semiconductor layer and the n-type semiconductor layer. It is preferable from the standpoint of power generation efficiency that the junction interface layer cover 30% or more of the whole junction interface, more preferably 50% or more, and further more preferably 100%.

In addition, it is preferable from the standpoint of power generation efficiency and carrier transfer that the average thickness of the junction interface layer be 1 nm or more, more preferably 20 nm or more, further more preferably 30 nm or more, and extremely preferably 50 nm or more. Moreover, it is preferable from the same standpoint that the average thickness be 500 µm or less, more preferably 100 µm or less, further more preferably 50 µm or less, extremely preferably 10 µm or less, and most preferably 5 µm or less. The present junction interface layer has a characteristic of having a high photoelectric conversion property even when the present junction interface layer has a thickness of 30 nm or more that makes a current due to tunneling effect hard to flow. The film thickness of the junction interface layer is measured by vertscan 2.0 (manufactured by Ryoka Systems Inc.) or cross section TEM observation.

In addition, it is preferable from the standpoint of allowing the semiconductor layer to absorb light that the junction interface layer be transparent to some extent. It is preferable that the transmittance of the junction interface layer for light having a wavelength of 550 nm be 35% or more, more preferably 50% or more, and further more preferably 70% or more. The transmittance can be measured by a spectrophotometer. The upper limit of the transmittance is not particularly limited but is 100% or less. The transmittance can be measured using a spectrophotometer. As a measurement substrate, quartz glass or a resin substrate can be used.

It is preferable that the resistivity of the junction interface layer be high. It is inferred that a high resistivity can contribute to prevention of a leak current. In addition, it is preferable from such standpoint that the resistivity be 10 Ωcm or more, more preferably 100 Ωcm or more, further more preferably 1000 Ωcm, extremely preferably 10000 Ωcm or more, and most preferably 1000000 Ωcm or more. The upper limit of the resistivity is not particularly limited; however, it is preferable that the upper limit of the resistivity be $1\times10^{19}$ Ωcm or less.

The resistivity in the present embodiments is a measure of tendency to conduct electricity and means resistivity per unit volume. The value is a value inherent to a substance and is determined by supplying a constant current I to a cross-sectional area W of a substance and measuring a potential difference V between electrodes arranged with a distance L.

$$\text{Resistivity}=(V/I)\times(W/L)$$

It is effective to manufacture the junction interface layer using a printing method because cost reduction is made possible. In this case, it is preferable that the substrate be the aforementioned flexible electrode substrate having plasticity. Thereby, since the electrode substrate comprising a junction interface layer can be wound up into a rolled shape, the production speed can be improved.

(Method for Producing Solar Cell)

The method for producing a solar cell of the present embodiment, for example, comprises: a step of obtaining a substrate with a semiconductor film by applying, on a substrate comprising an electrode, an application liquid for forming a semiconductor film to form a semiconductor film; a step of obtaining a substrate with a semiconductor layer by forming a semiconductor layer on a substrate with an electrode; and a step of sticking these substrates so that the semiconductor film and the semiconductor layer face each other. In this case, a substrate with another semiconductor film may be used in place of the substrate with a semiconductor layer. In addition, the production method of the present embodiment may also comprise a step of further providing a layer comprising a compound having a relative permittivity of 2 or more on the semiconductor film or the semiconductor layer.

Method for Producing Solar Cell Having Junction Interface Layer)

An example of the method for producing a solar cell having a junction interface layer is shown. The production method of the present embodiment comprises: a step of obtaining a laminate having a p-type semiconductor layer or an n-type semiconductor layer, and a layer comprising a compound having a relative permittivity of 2 or more on an electrode in this order; and a step of sticking another p-type semiconductor layer or another n-type semiconductor layer to the layer comprising a compound having a relative permittivity of 2 or more in the laminate. Specifically, a solar cell can be obtained, for example, through: step 1 of forming a p-type semiconductor layer on an electrode and thereafter applying an application liquid comprising a compound having a relative permittivity of 2 or more (forming a layer comprising a compound having a relative permittivity of 2 or more); step 2 of forming an n-type semiconductor layer on an electrode; and step 3 of sticking laminated bodies obtained by step 1 and step 2. In this production method, the p-type semiconductor layer and the n-type semiconductor layer may be exchanged. Moreover, it is preferable that one of the electrodes be transparent. In this example, the application liquid is applied in only step 1; however, the application liquid may be applied to the n-type semiconductor layer in step 2 and may be applied in both of step 1 and step 2. Namely, the application liquid may be applied to any of the p-type semiconductor layer and the n-type semiconductor layer and to both layers. Moreover, a step of drying the application liquid may be added after step 1 and step 2. The reason for this is because the layer comprising a compound having a relative permittivity of 2 or more may also be a layer obtained by removing a volatile component from the application liquid comprising a compound having a relative permittivity of 2 or more.

In addition, in the present embodiment, a solar cell may be manufactured by applying the application liquid comprising a compound having a relative permittivity of 2 or more on the p-type semiconductor layer, thereafter forming the n-type semiconductor layer thereon, and further forming an electrode thereon. Also in this case, the p-type semiconductor layer and the n-type semiconductor layer may be exchanged. Moreover, a step of conducting drying may be added after the application liquid is applied or the n-type semiconductor layer is formed.

The solar cell of the present embodiments can also be manufactured by a method comprising a step of obtaining a laminate by forming a layer comprising a compound having a relative permittivity of 2 or more on the p-type semiconductor layer or the n-type semiconductor layer. This method can comprise: the step and, furthermore, a step of obtaining another laminate by providing another p-type semiconductor layer or another n-type semiconductor layer on a transparent electrode and a step of sticking the laminate and the other laminate with the layer comprising a compound having a relative permittivity of 2 or more and the other p-type semiconductor layer or the other n-type semiconductor layer facing each other.

The suitable embodiments of the present invention have been described above; however, the present invention is not limited to these embodiments at all.

EXAMPLES

Hereinafter, the present invention will be described in more detail by specific Examples.

Evaluation Methods

Hereinafter, evaluation was conducted under conditions of 25° C. and a humidity of 45% unless otherwise specifically noted.
(1) Average Particle Size
With regard to the silicon particle, 100 particles were selected at random under a microscope, and the arithmetic mean value of the particle sizes each evaluated by an equivalent circle diameter using image analysis was defined as the average particle size. A digital microscope manufactured by Keyence Corporation was used as a microscope.

With regard to particles other than the silicon particles, a solution in which the particles were dispersed was prepared, and the average particle size was measured using a dynamic light scattering method. Measurement was conducted using a measuring apparatus "ELSZ-2" manufactured by Otsuka Electronics Co., Ltd.
(2) Evaluation of I-V Property A photovoltaic property was measured using a DC voltage and current supply (6241A manufactured by ADCMT) controlled by a computer (Solar cell IV measurement software manufactured by Systemhouse Sunrise Corp.) and a simplified solar simulator (XES-40S1 manufactured by San-Ei Electric Co., Ltd.) to conduct evaluation of an I-V property. A BS-500 Si photodiode detector (for crystal Si solar cell, manufactured by Bunkoukeiki Co., Ltd., secondary standard solar cell) was used for examination of quantity of light (AM 1.5G, 100 mW/cm$^2$).

Figure 13:
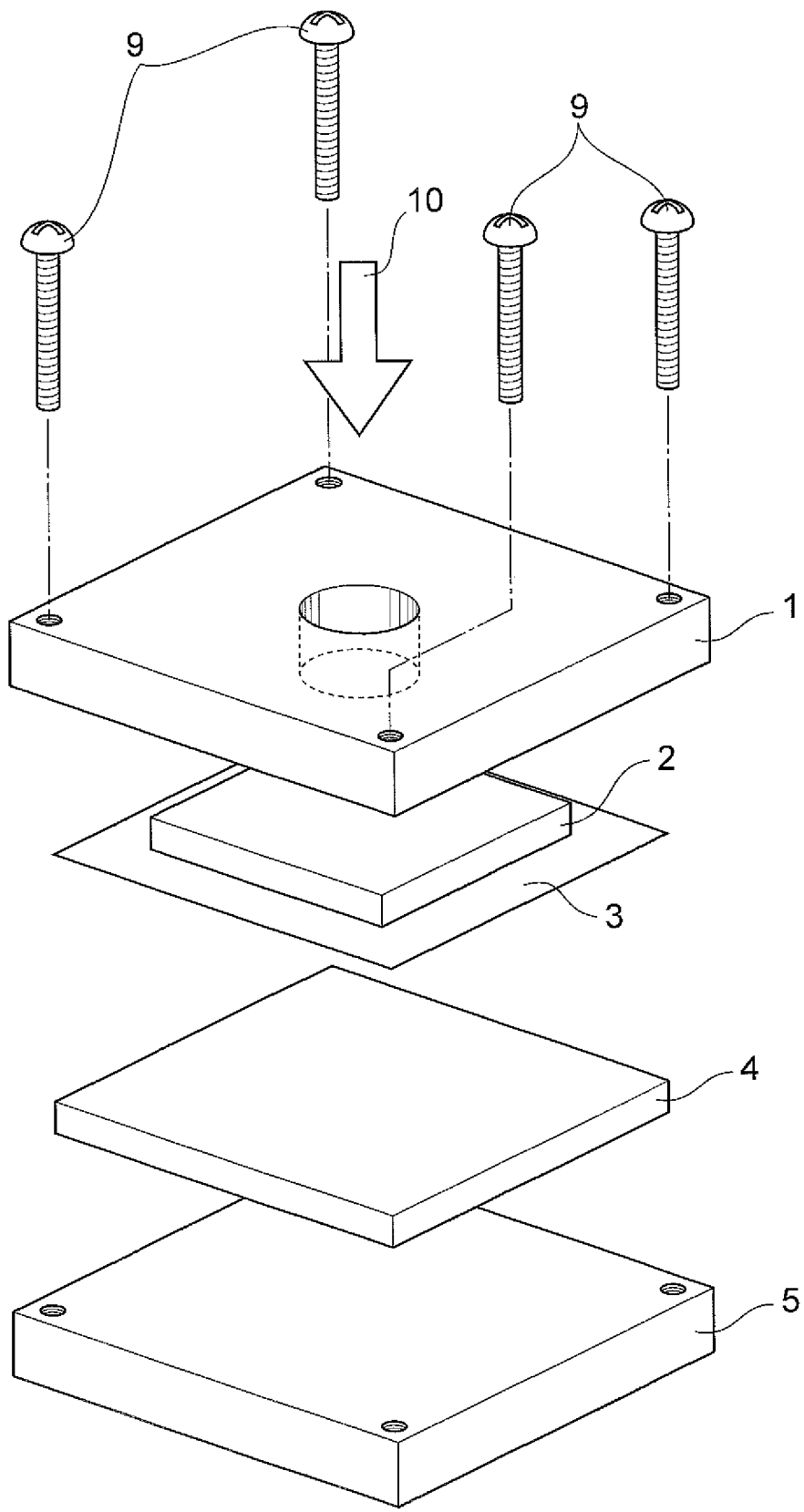
FIG. 13 is a diagram illustrating a specific preparation method of a sample for solar cell evaluation in Examples.

Measurement was conducted in a state where a solar cell was fixed. A specific preparation method of a measurement sample is described using FIG. 13. First of all, a solar cell 4 is placed on a metal jig 5 coated with an insulating treatment material. Silicon rubber 3 having a thickness of 2 mm, a quartz plate 2 having a thickness of 3 mm, and a metal jig 1 (a light transmission hole for transmitting light 10 is provided in the center thereof) coated with the insulating treatment material were stacked on the solar cell in this order, and each of the four corners of the metal jig 1 are fixed together with each of the four corners of the metal jig 5 with a screw 9.

In the present evaluation, the I-V property, and the Imax and the Vmax were determined. In addition, the Imax means a current when the output of the solar cell becomes maximum, and the Vmax is a voltage when the output of the solar cell becomes maximum.

And the short-circuit current density, the open-circuit voltage, the FF, and the photoelectric conversion efficiency were calculated out from a graph of the I-V property. In addition, the short-circuit current density (Isc) is current density when a voltage is 0, and the open-circuit voltage (Voc) is a voltage when a current is 0.

The FF can be determined from the following formula.

$$FF = (V\text{max} \cdot I\text{max})/(Voc \cdot Isc)$$

The photoelectric conversion efficiency η can be determined from the following formula.

$$\eta = (\text{output of solar cell})/100 \times 100$$

Output of solar cell=short-circuit current density× open-circuit voltage×$FF = V$max·Imax (3) Relative Permittivity The relative permittivity means a value measured by an impedance method setting a measurement frequency to 1 kHz and a measurement temperature to 23° C. Specifically, the relative permittivity can be determined from the following formula using an LCR meter (4284A PRECISION LCR MEIER manufactured by Agilent Technologies).

Dielectric constant of sample=(distance between electrodes×electrostatic capacity)/(area of electrode×dielectric constant of vacuum)

(where, the dielectric constant of vacuum is 8.854×10$^{-12}$ (F/m).)

When the sample is liquid, the dielectric constant is measured by inserting an electrode into the liquid using a jig for measuring liquid (16452A LIQUID TEST FIXTURE manufactured by Agilent Technologies).

When the sample is solid, the dielectric constant is measured by manufacturing a film on a plate of one electrode using a jig for measuring a film (16451B DIELECTRIC TEST FIXTURE manufactured by Agilent Technologies) and holding the film by the other electrode so that the film is held between the electrode and the other electrode.

(4) Transmittance

Evaluation of transmittance for light having a wavelength of 550 nm was conducted using UV-2500PC (manufactured by Shimadzu Corporation). The transmittance of a sample was determined by the following formula.

Transmittance of sample (%)=$A/B$×100

A=(transmittance of a laminate comprising a substrate/electrode/semiconductor layer or a layer comprising semiconductor film/sample)

B=(transmittance of a laminate comprising a substrate/electrode/semiconductor layer or a layer comprising semiconductor film)

(5) Resistivity

The resistivity is a measure of tendency to conduct electricity and means resistivity per unit volume. The value is a value inherent to a substance and is determined by supplying a constant current I to a cross-sectional area W of a substance and measuring a potential difference V between electrodes arranged with a distance L.

Resistivity=$(V/I) \times (W/L)$

The resistivity was measured using Loresta (Mitsubishi Chemical Analytech Co., Ltd.).

(6) Evaluation of Flexibility i) Electrode Substrate (a) Place an electrode substrate on a horizontal stand.

(b) Hold a half of an area of the electrode substrate, and bend the electrode substrate until an angle between the stand and the electrode substrate becomes 45 degrees. Thereafter, return the electrode substrate to its original state.

(c) Repeat the step (b) 5 times.

(d) Manufacture a solar cell by sticking a semiconductor layer or a semiconductor film to the electrode substrate.

(e) Confirm whether the solar cell can generate power or not by the evaluation of the property. When the power generation is confirmed, evaluate the flexibility as "sufficient".

ii) Solar Cell (a) Place a solar cell on a horizontal stand.

(b) Hold a half of an area of the solar cell, and bend the solar cell until an angle between the stand and the solar cell becomes 45 degrees. Thereafter, return the solar cell to its original state.

(c) Repeat the step (b) 5 times.

(d) Confirm whether the solar cell can generate power or not by the evaluation of the I-V property. When the power generation is confirmed, evaluate the flexibility as "sufficient".

(7) Film Thickness

The film thickness of the semiconductor layer and the junction interface layer was measured by vertscan 2.0 (manufactured by Ryoka Systems Inc.). The semiconductor layer or the junction interface layer for measurement was manufactured by coating the substrate on the same conditions as in the element production. Film thicknesses at arbitrary 5 points were measured for these layers, the average was calculated, and the average was defined as the average film thickness.

The film thickness of the semiconductor film was measured by a cross section SEM using a desktop scanning microscope Carry Scope JCM 5100 (manufactured by JEOL Ltd.). With respect to the semiconductor film, the cross section of the semiconductor element was measured. Cross section SEM measurement was conducted at 2 positions, and the film thicknesses were measured at 5 points with equal intervals for each position. The film thicknesses of a total of 10 points were measured, and the average was defined as the average film thickness.

The film thicknesses of the semiconductor layer, the junction interface layer, and the semiconductor film after manufacturing a solar cell were measured by cross section TEM observation. The measurement was conducted after cutting the cross section of the solar cell by an FIB method.

In the FIB method, Ga ions accelerated at 30 to 40 kV were focused to 0.01 to 0.1 µm, and sputtering was conducted while scanning the cross section of the solar cell. A carbon film or a tungsten film was vapor-deposited as a protection film of the outermost surface of the sputtering. Moreover, cross section TEM observation was conducted at 2 positions, and the film thicknesses were measured at 5 points with equal intervals for each position. The average value of the film thicknesses of a total of 10 points was calculated, and the average was defined as the average film thickness. It was confirmed that the average film thickness obtained by the cross section TEM observation had almost the same value as the results of the above-described film thickness measurement.

Example 1

(1) Preparation of Silicon Particle-Containing Application Liquid for Forming Semiconductor Film A p-type silicon crystal wafer having a resistivity of 1 Ωcm was pulverized under the presence of methanol by a ball mill method. A large excess of methanol was added after pulverization, and silicon particles having a particle size of 37 µm or more were classified by filtering with a nylon mesh having a sieve opening of 37 µm and a nylon mesh having a sieve opening of 100 µm. Further, by repeating methanol washing, silicon particles having particle sizes of 37 to 100 µm were obtained. The average particle size of the obtained silicon particles was 55 µm.

The silicon particles were weighed after vacuum drying, and a glycerin/ethanol mixed solvent (mass ratio 1/4) of 3 times the mass of the silicon particle was added and shaken to prepare an application liquid for forming a semiconductor film in which the silicon particles were dispersed in the glycerin/ethanol mixed solvent. With respect to the composition of the application liquid for forming a semiconductor film, the silicon particle was 25% by mass, glycerin was 15% by mass, and ethanol was 60% by mass.

(2) Film Production

The application liquid for forming a semiconductor film was drop-cast on a glass substrate with a fluorine-doped tin oxide (FTO) transparent electrode and heated at 120° C. on a hot plate to thereby remove ethanol. After removing ethanol, heating was further conducted at 150° C. for 3 minutes to manufacture a substrate with a semiconductor film. With respect to the composition of the semiconductor film, the silicon particle was 95% by mass, the total amount of glycerin and compounds generated by oxidation of glycerin was 5% by mass. The relative permittivity of glycerin was 48. The film thickness of the semiconductor film was 250 μm.

Example 2

(1) Preparation of CIGS Particle-Containing Application Liquid for Forming Semiconductor Film CIGS particle powder (manufactured by Kojundo Chemical Lab. Co., Ltd., composition: $Cu(In_{0.8}Ga_{0.2})S_2$) was added to a 1-thioglycerollethanol mixed solvent (mass ratio 1/4) to prepare a 5% by mass solution. Zirconia balls were added to the solution, ultrasonic treatment was conducted, and thereafter the solution was stirred and shaken for 10 hours. After stirring and shaking the solution, the zirconia balls were taken out. The particle sizes of the CIGS particles were 0.5 to 2.0 μm, and the average particle size of the CIGS particles was 0.8 μm. With respect to the composition of the application liquid for forming a semiconductor film, the CIGS particle was 5% by mass, 1-thioglycerol was 19% by mass, and ethanol was 76% by mass.

(2) Film Production

A substrate with a semiconductor film was manufactured under the same conditions as in Example 1. With respect to the composition of the semiconductor film, the CIGS particle was 90% by mass, and the total amount of 1-thioglycerol and compounds generated by oxidation of 1-thioglycerol was 10% by mass. The film thickness of the semiconductor film was 20 μm. The relative permittivity of 1-thioglycerol was 132.

Example 3

(1) Preparation of CIGS Particle-Containing Application Liquid for Forming Semiconductor Film An application liquid was prepared under the same conditions as in Example 2 except that the 1-thioglycerollethanol mixed solvent (mass ratio 1/4) was changed to a glycerin/ethanol mixed solvent (mass ratio 1/4). The particle sizes of the CIGS particles were 0.5 to 2.0 μm, and the average particle size of the CIGS particles was 0.8 μm. With respect to the composition of the application liquid for forming a semiconductor film, the CIGS particle was 5% by mass, glycerin was 19% by mass, and ethanol was 76% by mass.

(2) Film Production

A substrate with a semiconductor film was manufactured under the same conditions as in Example 1. With respect to the composition of the semiconductor film, the CIGS particle was 90% by mass, and the total amount of glycerin and compounds generated by oxidation of glycerin was 10% by mass. The film thickness of the semiconductor film was 20 μm.

Comparative Example 1

(1) Preparation of Silicon Particle-Containing Application Liquid for Forming Semiconductor Film Silicon particles were obtained under the same conditions as in Example 1 except that methanol was changed to toluene. The average particle size of the obtained silicon particles was 55 μm. The silicon particles were weighed after vacuum drying, and toluene of 3 times the mass of the silicon particle was added and shaken to prepare an application liquid for forming a semiconductor film in which the silicon particles were dispersed in toluene. With respect to the composition of the application liquid for forming a semiconductor film, the silicon particle was 25% by mass, and toluene was 75% by mass.

(2) Film Production

A substrate with a semiconductor layer was manufactured under the same conditions as in Example 1. With respect to the composition of the semiconductor layer, the silicon particle was 100%. The film thickness of the semiconductor layer was 250 μm.

Comparative Example 2

(1) Preparation of CIGS Particle-Containing Application Liquid for Forming Semiconductor Film CIGS particles were obtained under the same conditions as in Example 2 except that the 1-thioglycerol/ethanol mixed solvent (mass Ratio 1/4) was changed to ethanol. The particle size of the CIGS particles was 0.5 to 2.0 μm, and the average particle size of the CIGS particles was 0.8 μm. With respect to the composition of the application liquid for forming a semiconductor film, the CIGS particle was 5% by mass, and ethanol was 95% by mass.

(2) Film Production

A substrate with a semiconductor layer was manufactured under the same conditions as in Example 1. With respect to the composition of the semiconductor layer, the CIGS particle was 100% by mass. The film thickness of the semiconductor layer was 20 μm.

[Evaluation of Solar Cell Property 1]

Solar cells were manufactured using: the substrates with a p-type semiconductor film, the substrates obtained in Examples and Comparative Examples described above; an n-type semiconductor layer comprising titanium oxide; and a substrate comprising IZO as a transparent electrode. The n-type semiconductor layer was manufactured on the transparent electrode by a spin coating method using a water/2-butoxy ethanol mixed solvent comprising titanium oxide particles (anatase type, solid content 5% by mass) having an average particle size of 20 nm. In addition, the thickness of the n-type semiconductor film obtained as a result of drying at 120° C. for 60 minutes after spin coating was 500 nm. The substrate with a p-type semiconductor film and the substrate with an n-type semiconductor film were stuck to make a solar cell.

As a structure of a solar cell, Examples 1 to 3 each have a structure similar to the structure illustrated in FIG. 1. Comparative Examples 1 and 2 each have a structure almost similar to the structure illustrated in FIG. 9.

As evaluation of the I-V property of the solar cells, measurement was conducted adjusting the quantity of light so as to irradiate the solar cell with light having a quantity of light of 3 sun. Moreover, a positive electrode and a negative electrode were made by joining each electrode and a conductive tape using silver paste. Terminal during I-V measurement were taken from the conductive tape. The results are shown in Table 1.

Figure 10:
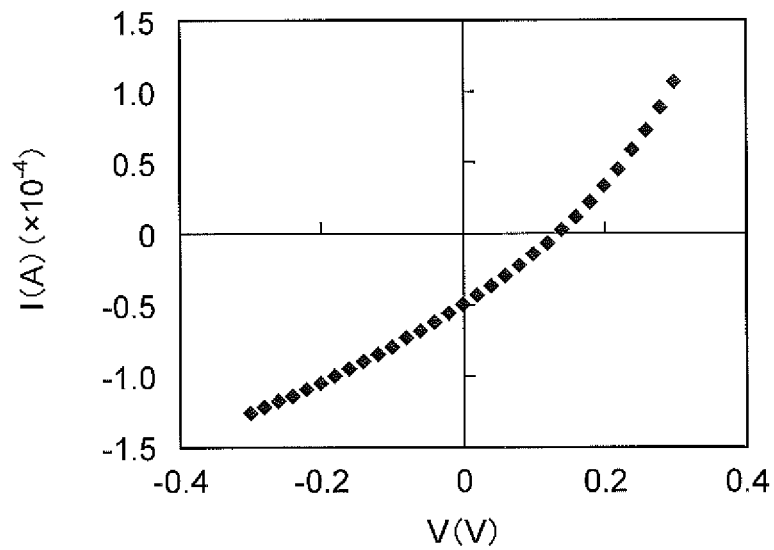
FIGS. 10(A) and 10(B) are graphs showing a property of solar cells comprising semiconductor films of Comparative Example 1 (A) and Example 1 (B), respectively.
Figure 10:
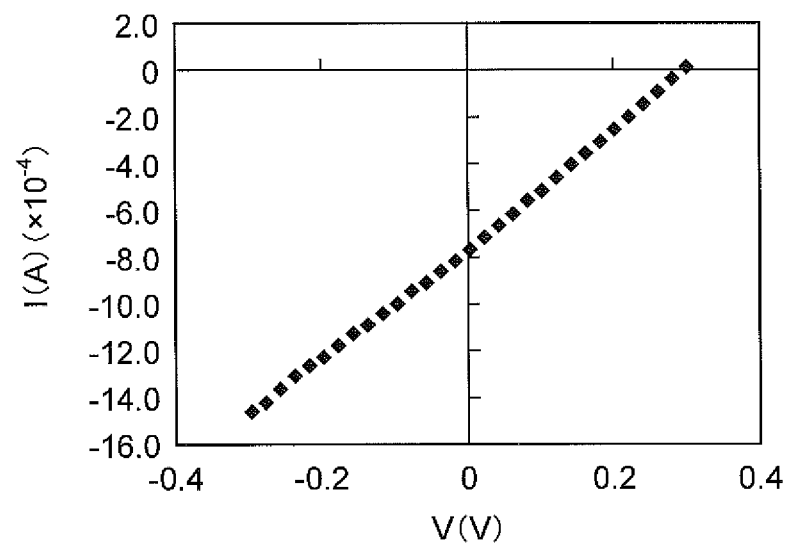

A solar cell having a semiconductor film of Example 1, the film comprising the silicon particle and glycerin, had a photoelectric conversion efficiency of 1.09%. A solar cell having a semiconductor layer of Comparative Example 1, the film consisting of only the silicon particle, had a photoelectric conversion efficiency of 0.035%. I-V curves for the solar cells of Comparative Example 1 and Example 1 are shown in FIGS. 10(A) and 10(B), respectively.

Figure 11:
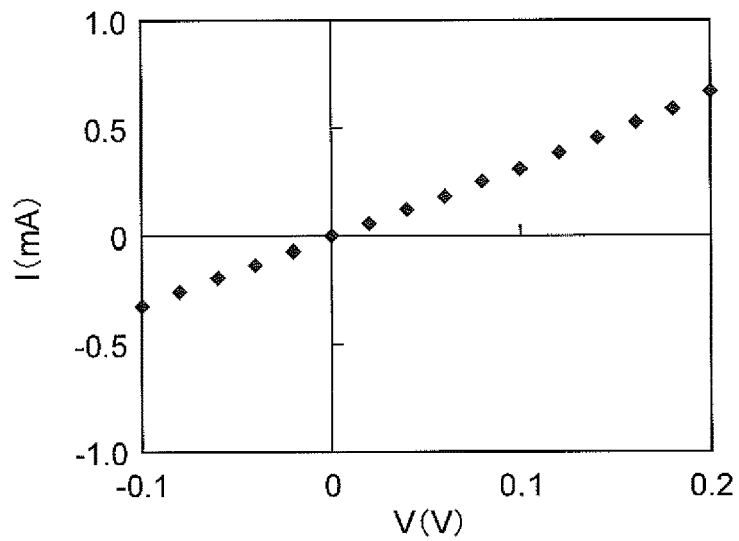
FIGS. 11(A), 11(B), and 11(C) are graphs showing a property of solar cells comprising semiconductor films of Comparative Example 2 (A), Example 2 (B), and Example 3 (C), respectively.
Figure 11:
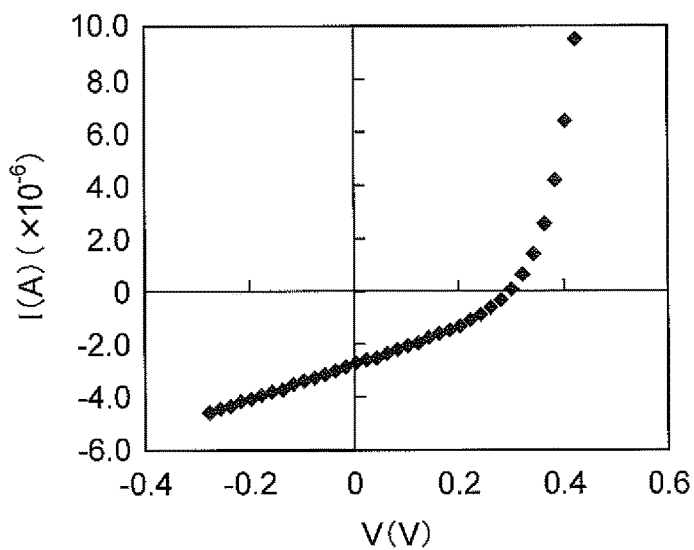
Figure 11:
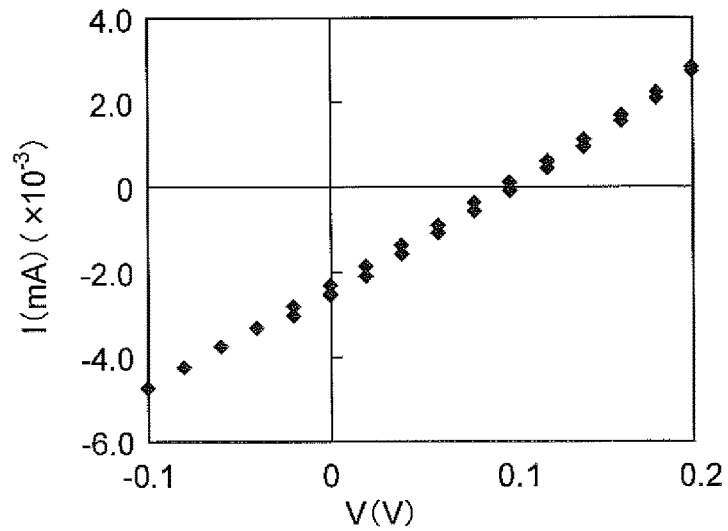

A solar cell having a semiconductor film of Example 2, the film comprising the CIGS particle and 1-thioglycerol, had a photoelectric conversion efficiency of 0.005%. A solar cell having a semiconductor film of Example 3, the film comprising the CIGS particle and glycerin, had a photoelectric conversion efficiency of 0.001%. A solar cell having a semiconductor layer of Comparative Example 2, the film consisting of only the CIGS particle, did not generate power. An I-V curve for the solar cell of Comparative Example 2 and I-V curves for the solar cells having the semiconductor films of Example 2 and Example 3 respectively are shown in FIGS. 11(A), 11(B), and 11(C) respectively.

TABLE 1

| | Composition of semiconductor film (% by mass) | | | | Photoelectric conversion efficiency (%) | Cell structure |
|---|---|---|---|---|---|---|
| | Silicon particle | GIGS particle | Glycerin and oxides | Thioglycerol and oxides | | |
| Example 1 | 95 | — | 5 | — | 1.09 | FIG. 1 |
| Example 2 | — | 90 | — | 10 | 0.005 | FIG. 1 |
| Example 3 | — | 90 | 10 | — | 0.001 | FIG. 1 |
| Comparative Example 1 | 100 | — | — | — | 0.035 | FIG. 9 |
| Comparative Example 2 | — | 100 | — | — | — | FIG. 9 |

Example 4

(1) Manufacture of Heterojunction Solar Cell Using Silicon Wafer

A titanium oxide layer comprising titanium oxide particles (rutile type, solid content 12% by mass) having an average particle size of 20 nm was manufactured on a PET film with ITO (manufactured by Aldrich, sheet resistance 60Ω/□) by a spin coating method. In addition, the thickness of the titanium oxide layer obtained as a result of drying at 120° C. for 10 minutes after spin coating was 300 nm. Coating was conducted by blade coating further on the titanium oxide layer with a liquid obtained by diluting cyanoethyl saccharose with 2-methoxyethanol to adjust the concentration to 20% by mass, and the coated liquid was dried at 120° C. for 1 minute. The thickness of the cyanoethyl saccharose layer was 600 nm. A solar cell was manufactured by sticking a p-type silicon crystal wafer having a thickness of 500 μm and a resistivity of 3 Ωcm on the cyanoethyl saccharose layer. The relative permittivity of cyanoethyl saccharose was 25.

Example 5

(1) Manufacture of Heterojunction Solar Cell Using Silicon Wafer

A solar cell was manufactured under the same conditions as in Example 4 except that the following hydrofluoric acid treatment was conducted to a p-type silicon crystal wafer having a thickness of 500 μm and a resistivity of 3 Ωcm. "Hydrofluoric acid treatment": the p-type silicon crystal wafer was washed with acetone to remove surface pollution, thereafter immersed in a 5% hydrofluoric acid for 5 minutes, and was washed with ultrapure water. Thereafter, the p-type silicon crystal wafer was washed with methanol. After washing, the wafer was dried under vacuum at room temperature for 1 hour.

Example 6

(1) Manufacture of Heterojunction Solar Cell Using Silicon Wafer

A solar cell was manufactured under the same conditions as in Example 5 except that the p-type silicon crystal wafer having a resistivity of 3 Ωcm was changed to a p-type silicon crystal wafer having a resistivity of 0.02 Ωcm.

Example 7

(1) Manufacture of Heterojunction Solar Cell Using Silicon Wafer

A solar cell was manufactured under the same conditions as in Example 5 except that the p-type silicon crystal wafer having a resistivity of 3 Ωcm was changed to a p-type silicon crystal wafer having a resistivity of 23 Ωcm.

Example 8

(1) Manufacture of Heterojunction Solar Cell Using Silicon Wafer

A titanium oxide layer comprising titanium oxide particles (anatase type, TKS 201, manufactured by Tayca Corporation, solid content 33% by mass) having an average particle size of 6 nm was manufactured on a PET film with ITO (manufactured by Aldrich, sheet resistance 60Ω/□) by a spin coating method. In addition, the thickness of the titanium oxide layer obtained as a result of drying at 120° C. for 10 minutes after spin coating was 2000 nm. Coating was conducted by blade coating further on the titanium oxide layer with a liquid obtained by diluting cyanoethyl saccharose with 2-methoxyethanol to adjust the concentration to 20% by mass, and the coated liquid was dried at 120° C. for 1 minute. The thickness of the cyanoethyl saccharose layer was 600 nm. On the other hand, the hydrofluoric acid treatment was conducted to a p-type silicon crystal wafer having a thickness of 500 μm and a resistivity of 3 Ωcm. A solar cell was manufactured by sticking the silicon crystal wafer and the titanium oxide film coated with cyanoethyl saccharose.

Comparative Example 3

(1) Manufacture of Heterojunction Solar Cell Using Silicon Wafer

A thin film of a titanium oxide particle (rutile type, solid content 12% by mass) having an average particle size of 20 nm was manufactured on a PET film with ITO (manufactured by Aldrich, sheet resistance 60Ω/□) by a spin coating method. In addition, the thickness of the thin film obtained as a result of drying at 120° C. for 10 minutes after spin coating was 300 nm. On the other hand, the hydrofluoric acid treatment was conducted to a p-type silicon crystal wafer having a thickness of 500 μm and a resistivity of 0.02 Ωcm. A solar cell was manufactured by sticking the silicon crystal wafer and the titanium oxide film.

[Evaluation of Solar Cell Property 2]

Solar cells of Examples 4 to 8 and Comparative Example 3 were evaluated. The cell structures of Examples 4 to 8 are similar to the structure illustrated in FIG. 6. The cell structure of Comparative Example 3 is almost similar to the structure illustrated in FIG. 9. As evaluation of the I-V property of the solar cells, measurement was conducted adjusting the quantity of light so as to irradiate the solar cell with light having a quantity of light of 1 sun. Moreover, a conductive tape and silicon were joined to a silicon-side electrode using indium-gallium alloy paste in both of Examples and Comparative Example. Moreover, with respect to the titanium oxide side, the ITO electrode and a conductive tape were joined using silver paste. Terminals during I-V measurement were taken from the conductive tape. The results are shown in Tables 2 and 3.

As shown in Tables 2 and 3, it was found that, with respect to the systems in which a cyano group-containing organic compound was introduced to the pn interface, the short-circuit current density and the open-circuit voltage were improved and the conversion efficiency became high. Furthermore, a conversion efficiency of 5% or more was exhibited by changing the resistivity of silicon and the kind of titanium oxide.

TABLE 2

| | Hydrofluoric acid treatment | Resistivity of silicon (Ωcm) | Crystal structure of titanium oxide | Layer containing a compound having relative permittivity of 2 or more (junction interface layer) |
|---|---|---|---|---|
| Example 4 | — | 3 | Rutile type | Cyanoethyl saccharose |
| Example 5 | ○ | 3 | Rutile type | Cyanoethyl saccharose |
| Example 6 | ○ | 0.02 | Rutile type | Cyanoethyl saccharose |
| Example 7 | ○ | 23 | Rutile type | Cyanoethyl saccharose |
| Example 8 | ○ | 3 | Anatase type | Cyanoethyl saccharose |
| Comparative Example 3 | ○ | 0.02 | Rutile type | — |

TABLE 3

| | Junction interface layer thickness (nm) | Cell structure | Short-circuit current density (mA/cm$^2$) | Open-circuit voltage (V) | FF | Photoelectric conversion efficiency (%) |
|---|---|---|---|---|---|---|
| Example 4 | 600 | FIG. 6 | 13.8 | 0.54 | 0.22 | 1.62 |
| Example 5 | 600 | FIG. 6 | 27.6 | 0.54 | 0.22 | 3.21 |
| Example 6 | 600 | FIG. 6 | 7.9 | 0.26 | 0.26 | 0.53 |
| Example 7 | 600 | FIG. 6 | 12.8 | 0.54 | 0.25 | 1.69 |
| Example 8 | 600 | FIG. 6 | 47.3 | 0.49 | 0.24 | 5.48 |
| Comparative Example 3 | — | FIG. 9 | 0.72 | 0.14 | 0.25 | 0.02 |

Example 9

(1) Preparation of Silicon Particle-Containing Application Liquid for Forming Semiconductor Film A p-type silicon crystal wafer having a resistivity of 1 Ωcm was pulverized under the presence of methanol by a ball mill method. A large excess of methanol was added after pulverization, and silicon particles having a particle size of 37 μm or less were classified by filtering with a nylon mesh having a sieve opening of 37 μm. Furthermore, by conducting decantation with a methanol solvent, silicon particles having particle sizes of 10 to 37 μm were obtained. The average particle size of the obtained silicon particles was 20 μm.

The silicon particles were weighed after vacuum drying, and a glycerin/ethanol mixed solvent (mass ratio 1/4) of 3 times the mass of the silicon particle was added and shaken to prepare an application liquid for forming a semiconductor film in which the silicon particles were dispersed in the glycerin/ethanol mixed solvent. With respect to the composition of the application liquid for forming a semiconductor film, the silicon particle was 25% by mass, glycerin was 15% by mass, and ethanol was 60% by mass.

(2) Film Production

The application liquid for forming a semiconductor film was drop-cast on a glass substrate with a fluorine-doped tin oxide (FTO) transparent electrode and heated at 120° C. on a hot plate to thereby remove ethanol. After removing ethanol, heating was further conducted at 150° C. for 3 minutes to manufacture a substrate with a semiconductor film. With respect to the composition of the semiconductor film, the silicon particle was 95% by mass, and the total amount of glycerin and compounds generated by oxidation of glycerin was 5% by mass. The film thickness was 250 μm.

(3) Manufacture of Solar Cell

A solar cell was manufactured by sticking a substrate comprising IZO as a transparent electrode, the substrate with a p-type semiconductor film, and an n-type semiconductor layer comprising titanium oxide. The n-type semiconductor layer was manufactured by a spin coating method using titanium oxide particles (anatase type, TKS 201, manufactured by Tayca Corporation, solid content 33% by mass) having an average particle size of 6 nm. In addition, the thickness of the n-type semiconductor layer obtained as a result of drying at 120° C. for 10 minutes after spin coating was 500 nm.

Example 10

(1) Preparation of Silicon Particle-Containing Application Liquid for Forming Semiconductor Film A p-type silicon crystal wafer having a resistivity of 1 Ωcm was pulverized under the presence of methanol by a ball mill method. A large excess of methanol was added after pulverization, and silicon particles having particle sizes of 37 to 100 μm were obtained by filtering with a nylon mesh having a sieve opening of 37 μm and a nylon mesh having a sieve opening of 100 μm. The average particle size of the obtained silicon particles was 55 μm.

The silicon particles were weighed after vacuum drying, and a glycerin/ethanol mixed solvent (mass ratio 1/4) of 3 times the mass of the silicon particle was added and shaken to prepare an application liquid for forming a semiconductor film in which the silicon particles were dispersed in the glycerin/ethanol mixed solvent. With respect to the composition of the application liquid for forming a semiconductor film, the silicon particle was 25% by mass, glycerin was 15% by mass, and ethanol was 60% by mass.

(2) Film Production

A semiconductor film was manufactured under the same conditions as in Example 9. With respect to the composition of the semiconductor film, the silicon particle was 95% by mass, the total amount of glycerin and compounds generated by oxidation of glycerin was 5% by mass. The film thickness was 300 μm.

(3) Manufacture of Solar Cell

A solar cell was manufactured using the substrate with a p-type semiconductor film, an n-type semiconductor layer comprising zinc oxide, and a substrate comprising IZO as a transparent electrode. The n-type semiconductor layer was manufactured by a spin coating method using a butyl acetate solvent comprising zinc oxide particles (solid content 40% by mass, manufactured by Aldrich) having an average particle size of 35 nm. In addition, the thickness of the n-type semiconductor layer obtained as a result of drying at 120° C. for 60 minutes after spin coating was 600 nm

Example 11

(1) Preparation of Silicon Particle-Containing Application Liquid for Forming Semiconductor Film A p-type silicon crystal wafer having a resistivity of 3 Ωcm was pulverized under the presence of methanol by a ball mill method. A large excess of methanol was added after pulverization, and silicon particles having particle sizes of 32 μm or more and 57 μm or less were classified by filtering with a nylon mesh having a sieve opening of 32 μm and a nylon mesh having a sieve opening of 57 μm. The average particle size of the obtained silicon particles was 43 μm.

The silicon particles were weighed after vacuum drying, and a glycerin/ethanol mixed solvent (mass ratio 1/4) of 3 times the mass of the silicon particle was added and shaken to prepare an application liquid for forming a semiconductor film in which the silicon particles were dispersed in the glycerin/ethanol mixed solvent. With respect to the composition of the application liquid for forming a semiconductor film, the silicon particle was 25% by mass, glycerin was 15% by mass, and ethanol was 60% by mass.

(2) Film Production

A substrate with a semiconductor film was manufactured under the same conditions as in Example 9 except that the substrate was changed to SUS 304. With respect to the composition of the semiconductor film, the silicon particle was 95% by mass, the total amount of glycerin and compounds generated by oxidation of glycerin was 5% by mass. The film thickness was 250 μm.

(3) Manufacture of Solar Cell

A solar cell was manufactured using the substrate with a p-type semiconductor film, an n-type semiconductor layer comprising titanium oxide, and a PET film comprising ITO (manufactured by Aldrich, sheet resistance 60Ω/□) as a transparent electrode.

The n-type semiconductor layer was manufactured by a spin coating method using an aqueous dispersion liquid comprising titanium oxide particles (anatase type, TKS 201, manufactured by Tayca Corporation, solid content 33% by mass) having an average particle size of 6 nm. In addition, the thickness of the n-type semiconductor layer obtained as a result of drying at 120° C. for 10 minutes after spin coating was 600 nm.

Example 12

(1) Preparation of Silicon Particle-Containing Application Liquid for Forming Semiconductor Film Silicon particles were obtained under the same conditions as in Example 11. The average particle size of the obtained silicon particles was 43 μm.

The silicon particles were weighed after vacuum drying, and a glycerin/ethanol mixed solvent (mass ratio 1/3) and a 2-methoxyethanol solution of cyanoethyl polyvinyl alcohol were added and shaken. As a result thereof, an application liquid for forming a semiconductor film in which the silicon particles were dispersed in a glycerin/ethanol/2-methoxyethanol mixed solution where cyanoethyl polyvinyl alcohol was dissolved, was prepared. With respect to the composition of the application liquid for forming a semiconductor film, the silicon particle was 20% by mass, cyanoethyl polyvinyl alcohol was 4% by mass, glycerin was 19% by mass, and ethanol was 57% by mass.

(2) Film Production

A substrate with a semiconductor film was manufactured in the same manner as in Example 11. With respect to the composition of the semiconductor film, the silicon particle was 80% by mass, cyanoethyl polyvinyl alcohol was 16% by mass, the total amount of glycerin and compounds generated by oxidation of glycerin was 4% by mass. The relative permittivity of cyanoethyl polyvinyl alcohol was 15. The film thickness of the semiconductor film was 250 μm.

(3) Manufacture of Solar Cell

Using a PET film comprising ITO (manufactured by Aldrich, sheet resistance 60Ω/□) as a transparent electrode, an n-type semiconductor layer comprising titanium oxide was manufactured thereon. The n-type semiconductor layer was manufactured by a spin coating method using an aqueous dispersion liquid comprising titanium oxide particles (anatase type, TKS 201, manufactured by Tayca Corporation, solid content 33% by mass) having an average particle size of 6 nm. In addition, the thickness of the thin film obtained as a result of drying at 120° C. for 10 minutes after spin coating was 600 nm. Coating was conducted by blade coating further on the titanium oxide layer with a liquid obtained by diluting cyanoethyl saccharose with 2-methoxyethanol to adjust the concentration to 20% by mass, and the coated liquid was dried at 120° C. for 1 minute. The thickness of the cyanoethyl saccharose was 600 nm. A solar cell was manufactured by sticking the substrate with the p-type semiconductor film on the layer thus obtained.

[Evaluation of Solar Cell Property 3]

Evaluation of the I-V properties of solar cells of Examples 9 to 12 were conducted. With respect to electrodes of the solar cells, a positive electrode and a negative electrode were made by joining each electrode and a conductive tape using silver paste. Terminals during I-V measurement were taken from the conductive tape. As evaluation of the I-V property of the solar cells, measurement was conducted adjusting the quantity of light so as to irradiate the solar cell with light having a quantity of light of 3 sun. The cell structures of Examples 9 to 11 are similar to the structure illustrated in FIG. 1. The cell structure of Example 12 is similar to the structure illustrated in FIG. 7. The results are shown in Tables 4 and 5.

Figure 12:
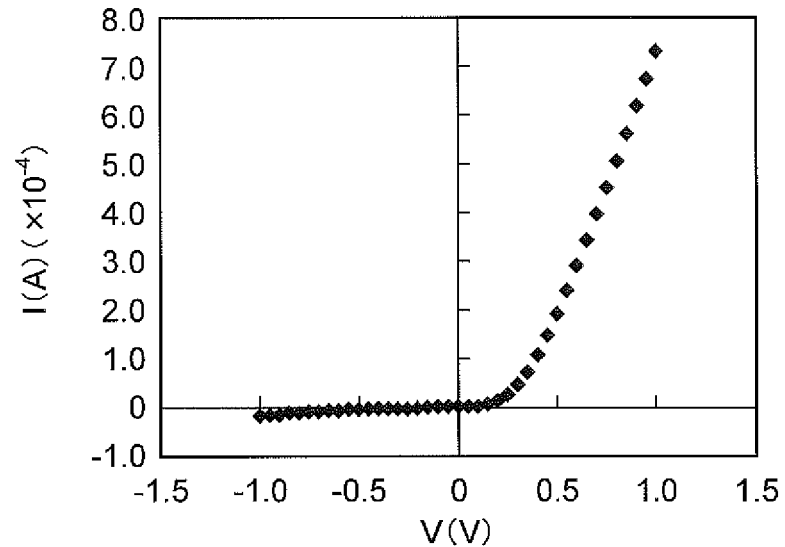
FIG. 12 is a graph showing a property of a solar cell comprising a semiconductor film of Example 12.
Figure 12:
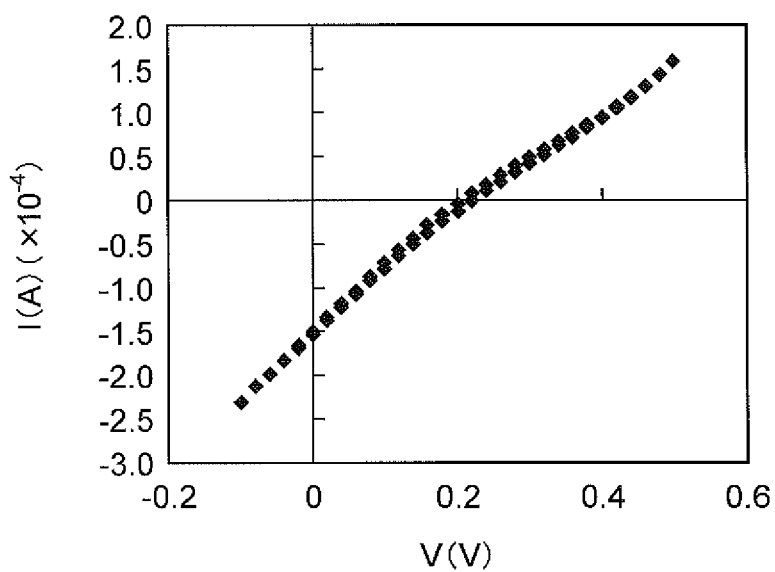

As shown in Tables 4 and 5, it was confirmed that the performance was improved by introducing a p-type semiconductor film comprising glycerin and the performance of the solar cell in which a cyano group-containing organic compound was introduced to the pn interface was further improved. The I-V properties before and after light irradiation for Example 12 are shown in FIG. 12 ((A) shows the I-V property before light irradiation and (B) shows the I-V property after light irradiation).

TABLE 4

| | Silicon particle | | Composition of semiconductor film (% by mass) | | | | Layer containing a compound having relative permittivity of 2 or more (junction interface layer) |
|---|---|---|---|---|---|---|---|
| | Average particle size (nm) | Resistivity (Ωcm) | Silicon particle | Glycerin and oxides | Cyanoethyl polyvinyl alcohol | n-Type semiconductor layer | |
| Example 1 | 55 | 1 | 95 | 5 | — | Titanium oxide | — |
| Example 9 | 20 | 1 | 95 | 5 | — | Titanium oxide | — |
| Example 10 | 55 | 1 | 95 | 5 | — | Zinc oxide | — |
| Example 11 | 43 | 3 | 95 | 5 | — | Titanium oxide | — |
| Example 12 | 43 | 3 | 80 | 4 | 16 | Titanium oxide | Cyanoethyl saccharose |

TABLE 4-continued

| | Silicon particle | | Composition of semiconductor film (% by mass) | | | n-Type semiconductor layer | Layer containing a compound having relative permittivity of 2 or more (junction interface layer) |
|---|---|---|---|---|---|---|---|
| | Average particle size (nm) | Resistivity (Ωcm) | Silicon particle | Glycerin and oxides | Cyanoethyl polyvinyl alcohol | | |
| Comparative Example 1 | 55 | 1 | 100 | — | — | Titanium oxide | — |

TABLE 5

| | Cell structure | Short-circuit current density (mA/cm$^2$) | Open-circuit voltage (V) | FF | Photoelectric conversion efficiency (%) |
|---|---|---|---|---|---|
| Example 1 | FIG. 1 | 43.5 | 0.29 | 0.26 | 1.09 |
| Example 9 | FIG. 1 | 24.3 | 0.23 | 0.26 | 0.48 |
| Example 10 | FIG. 1 | 20.1 | 0.29 | 0.26 | 0.42 |
| Example 11 | FIG. 1 | 6.51 | 0.23 | 0.25 | 0.34 |
| Example 12 | FIG. 7 | 8.72 | 0.22 | 0.24 | 0.45 |
| Comparative Example 1 | FIG. 9 | 2.85 | 0.14 | 0.27 | 0.035 |

Example 13

(1) Manufacture of Heterojunction Solar Cell Using Silicon Wafer

A titanium oxide layer was manufactured on a PET film with ITO (manufactured by Aldrich, sheet resistance 60Ω/□) by a spin coating method using an aqueous dispersion liquid comprising titanium oxide particles (anatase type, TKS 201, manufactured by Tayca Corporation, solid content 33% by mass) having an average particle size of 6 nm. In addition, the thickness of the titanium oxide layer obtained as a result of drying at 120° C. for 10 minutes after spin coating was 1500 nm. A thin film was manufactured further on the titanium oxide layer by a spin coating method using a liquid obtained by diluting polyvinylidene fluoride (PVDF) with N-methyl pyrrolidone (NMP) to adjust the concentration to 0.1% by mass, and the thin film was dried at 120° C. for 1 minute. The thickness of the PVDF layer was 50 nm. On the other hand, the hydrofluoric acid treatment was conducted to a p-type silicon crystal wafer having a thickness of 500 μm and a resistivity of 3 Ωcm. A solar cell was manufactured by sticking the silicon crystal wafer and the titanium oxide film coated with PVDF. The relative permittivity of PVDF was 8.

Example 14

(1) Manufacture of Heterojunction Solar Cell Using Silicon Wafer

Manufacture of a heterojunction solar cell was conducted in the same manner as in Example 13 except that a liquid obtained by diluting polyvinylidene fluoride (PVDF) with N-methyl pyrrolidone (NMP) to adjust the concentration to 5% by mass was used. The thickness of the PVDF layer was 550 nm.

[Evaluation of Solar Cell Property 4]

Solar cells of Examples 13 and 14 and Comparative Example 3 were evaluated. The cell structures of Examples 13 and 14 are similar to the structure illustrated in FIG. 6. The cell structure of Comparative Example 3 is almost similar to the structure illustrated in FIG. 9. As evaluation of the I-V properties of the solar cells, measurement was conducted adjusting the quantity of light so as to irradiate the solar cell with light having a quantity of light of 1 sun. Moreover, a conductive tape and the silicon wafer were joined to a silicon wafer-side electrode using indium-gallium alloy paste. Moreover, with respect to the titanium oxide layer side, the ITO electrode and a conductive tape were joined using silver paste. Terminals during I-V measurement were taken from the conductive tape. The results are shown in Tables 6 and 7.

TABLE 6

| | Hydrofluoric acid treatment | Resistivity of silicon (Ωcm) | Crystal structure of titanium oxide | Layer containing a compound having relative permittivity of 2 or more (junction interface layer) |
|---|---|---|---|---|
| Example 13 | ○ | 3 | Anatase type | PVDF |
| Example 14 | ○ | 3 | Anatase type | PVDF |
| Comparative Example 3 | ○ | 0.02 | Rutile type | — |

TABLE 7

| | Junction interface layer thickness (nm) | Cell structure | Short-circuit current density (mA/cm$^2$) | Open-circuit voltage (V) | FF | Photoelectric conversion efficiency (%) |
|---|---|---|---|---|---|---|
| Example 13 | 50 | FIG. 6 | 24 | 0.49 | 0.21 | 2.6 |
| Example 14 | 550 | FIG. 6 | 27 | 0.5 | 0.21 | 2.9 |

TABLE 7-continued

| | Junction interface layer thickness (nm) | Cell structure | Short-circuit current density (mA/cm$^2$) | Open-circuit voltage (V) | FF | Photoelectric conversion efficiency (%) |
|---|---|---|---|---|---|---|
| Comparative Example 3 | — | FIG. 9 | 0.72 | 0.14 | 0.25 | 0.02 |

As shown in Tables 6 and 7, it was found that the short-circuit current and the open-circuit voltage were improved and the conversion efficiency became high in the systems in which a material having a high dielectric constant was introduced to the pn interface.

Example 15

(1) Manufacture of Heterojunction Solar Cell Using Silicon Wafer

A titanium oxide layer was manufactured on a PET film with ITO (manufactured by Aldrich, sheet resistance 60Ω/□) by a spin coating method using an aqueous dispersion liquid comprising titanium oxide particles (anatase type, TKS 201, manufactured by Tayca Corporation, solid content 33% by mass) having an average particle size of 6 nm. In addition, the thickness of the titanium oxide layer obtained as a result of drying at 120° C. for 10 minutes after spin coating was 1500 nm. A film was produced further on the titanium oxide layer by a spin coating method using a liquid obtained by diluting cyanoethyl saccharose with 2-methoxyethanol to adjust the concentration to 0.1% by mass, and the film was dried at 120° C. for 1 minute. The thickness of the cyanoethyl saccharose layer was 20 nm. On the other hand, a p-type silicon crystal wafer having a thickness of 500 μm and a resistivity of 3 Ωcm was washed with methanol. A solar cell was manufactured by sticking the silicon crystal wafer which was dried after washing and the titanium oxide film coated with cyanoethyl saccharose.

Example 16

(1) Manufacture of Heterojunction Solar Cell Using Silicon Wafer

Manufacture of a heterojunction solar cell was conducted in the same manner as in Example 15 except that a liquid obtained by diluting cyanoethyl saccharose with 2-methoxyethanol to adjust the concentration to 1% by mass was used. The thickness of the cyanoethyl saccharose layer was 40 mm Example 17

(1) Manufacture of Heterojunction Solar Cell Using Silicon Wafer

Manufacture of a heterojunction solar cell was conducted in the same manner as in Example 15 except that a liquid obtained by diluting cyanoethyl saccharose with 2-methoxyethanol to adjust the concentration to 5% by mass was used. The thickness of the cyanoethyl saccharose layer was 150 nm.

Example 18

(1) Manufacture of Heterojunction Solar Cell Using Silicon Wafer

Manufacture of a heterojunction solar cell was conducted in the same manner as in Example 15 except that a liquid obtained by diluting cyanoethyl saccharose with 2-methoxyethanol to adjust the concentration to 20% by mass was used. The thickness of the cyanoethyl saccharose layer was 600 nm.

Example 19

(1) Manufacture of Heterojunction Solar Cell Using Silicon Wafer

Manufacture of a heterojunction solar cell was conducted in the same manner as in Example 15 except that a liquid obtained by diluting cyanoethyl saccharose with 2-methoxyethanol to adjust the concentration to 40% by mass was used. The thickness of the cyanoethyl saccharose layer was 2100 nm.

Example 20

(1) Manufacture of Heterojunction Solar Cell Using Silicon Wafer

Manufacture of a heterojunction solar cell was conducted in the same manner as in Example 15 except that a liquid obtained by diluting cyanoethyl saccharose with 2-methoxyethanol to adjust the concentration to 40% by mass was used. The thickness of the cyanoethyl saccharose layer was 5000 nm.

Comparative Example 4

(1) Manufacture of Heterojunction Solar Cell Using Silicon Wafer

A thin film was manufactured on a PET film with ITO (manufactured by Aldrich, sheet resistance 60Ω/□) by a spin coating method using an aqueous dispersion liquid comprising titanium oxide particles (anatase type, TKS 201, manufactured by Tayca Corporation, solid content 33% by mass) having an average particle size of 6 nm. In addition, the thickness of the thin film obtained as a result of drying at 120° C. for 10 minutes after spin coating was 1500 nm. On the other hand, a p-type silicon crystal wafer having a thickness of 500 μm and a resistivity of 3 Ωcm was washed with methanol. A solar cell was manufactured by sticking the silicon crystal wafer which was dried after washing and the titanium oxide film.

[Evaluation of Solar Cell Property 5]

Solar cells of Examples 15 to 20 and Comparative Example 4 were evaluated. The cell structures of Examples 15 to 20 are similar to the structure illustrated in FIG. 6. As evaluation of the I-V properties of the solar cells, measurement was conducted adjusting the quantity of light so as to irradiate the solar cell with light having a quantity of light of 1 sun. Moreover, a conductive tape and the silicon wafer were joined to a silicon wafer-side electrode using indium-gallium alloy paste. Moreover, with respect to the titanium oxide layer side, the ITO electrode and a conductive tape were joined using silver paste. Terminals during I-V measurement were taken from the conductive tape. The results are shown in Tables 8 and 9.

TABLE 8

| | Hydrofluoric acid treatment | Resistivity of silicon ($\Omega$cm) | Crystal structure of titanium oxide | Layer containing a compound having relative permittivity of 2 or more (junction interface layer) |
|---|---|---|---|---|
| Example 15 | — | 3 | Anatase type | Cyanoethyl saccharose |
| Example 16 | — | 3 | Anatase type | Cyanoethyl saccharose |
| Example 17 | — | 3 | Anatase type | Cyanoethyl saccharose |
| Example 18 | — | 3 | Anatase type | Cyanoethyl saccharose |
| Example 19 | — | 3 | Anatase type | Cyanoethyl saccharose |
| Example 20 | — | 3 | Anatase type | Cyanoethyl saccharose |
| Comparative Example 4 | — | 3 | Anatase type | — |

TABLE 9

| | Junction interface layer thickness (nm) | Cell structure | Short-circuit current density (mA/cm$^2$) | Open-circuit voltage (V) | FF | Photoelectric conversion efficiency (%) |
|---|---|---|---|---|---|---|
| Example 15 | 20 | FIG. 6 | 6.4 | 0.42 | 0.17 | 0.5 |
| Example 16 | 40 | FIG. 6 | 11.2 | 0.44 | 0.14 | 0.7 |
| Example 17 | 150 | FIG. 6 | 11 | 0.43 | 0.15 | 0.7 |
| Example 18 | 600 | FIG. 6 | 29.7 | 0.5 | 0.2 | 2.9 |
| Example 19 | 2100 | FIG. 6 | 37.7 | 0.46 | 0.16 | 2.7 |
| Example 20 | 5000 | FIG. 6 | 13.3 | 0.46 | 0.13 | 0.8 |
| Comparative Example 4 | — | FIG. 9 | 1.9 | 0.5 | 0.22 | 0.2 |

As shown in Tables 8 and 9, it was found that when the thickness of the cyano group-containing organic compound introduced to the pn interface was changed, the short-circuit current and the open-circuit voltage were improved and the conversion efficiency became high at a thickness of at least 40 nm or more.

Evaluation of Transmittance of Junction Interface Layer

Example 21

A titanium oxide layer was manufactured on a PET film with ITO (manufactured by Aldrich, sheet resistance 60$\Omega$/□) by a spin coating method using an aqueous dispersion liquid comprising titanium oxide particles (anatase type, TKS 201, manufactured by Tayca Corporation, solid content 33% by mass) having an average particle size of 6 nm. In addition, the thickness of the titanium oxide layer obtained as a result of drying at 120° C. for 10 minutes after spin coating was 1500 nm. A film was produced further on the titanium oxide layer by a spin coating method using a liquid obtained by diluting cyanoethyl saccharose with 2-methoxyethanol to adjust the concentration to 20% by mass, and the film was dried at 120° C. for 1 minute. The thickness of the cyanoethyl saccharose layer was 600 nm.

The transmittance of the cyanoethyl saccharose layer measured by the aforementioned method was 90%.

Example 22

A titanium oxide layer was manufactured on a PET film with ITO (manufactured by Aldrich, sheet resistance 60$\Omega$/□) by a spin coating method using an aqueous dispersion liquid comprising titanium oxide particles (anatase type, TKS 201, manufactured by Tayca Corporation, solid content 33% by mass) having an average particle size of 6 nm. In addition, the thickness of the titanium oxide layer obtained as a result of drying at 120° C. for 10 minutes after spin coating was 1500 nm. A thin film was manufactured further on the titanium oxide layer by a spin coating method using a liquid obtained by diluting polyvinylidene fluoride (PVDF) with N-methyl pyrrolidone (NMP) to adjust the concentration to 5% by mass, and the thin film was dried at 120° C. for 1 minute. The thickness of the PVDF layer was 550 nm.

The transmittance of the PVDF layer measured by the aforementioned method was 36%.

The results of transmittances of Examples 21 and 22 are shown together in Table 10. It is found that the transmittance is high in both Examples 21 and 22.

TABLE 10

| | Layer containing a compound having relative permittivity of 2 or more (junction interface layer) | Transmittance (%) |
|---|---|---|
| Example 21 | Cyanoethyl saccharose | 90 |
| Example 22 | PVDF | 36 |

Evaluation of Resistivity of Junction Interface Layer

Example 23

The resistivity of the cyanoethyl saccharose layer described in Example 21, namely, the junction interface layer, was measured by the above-described method.

Example 24

The resistivity of the PVDF layer described in Example 22, namely, the junction interface layer, was measured by the above-described method.

The results of resistivities of Examples 23 and 24 are shown together in Table 11. It is found that the resistivity is high in both Examples 23 and 24.

TABLE 11

| | Layer containing a compound having relative permittivity of 2 or more (junction interface layer) | Resistivity (Ωcm) |
|---|---|---|
| Example 23 | Cyanoethyl saccharose | $1.0 \times 10^7$ or more |
| Example 24 | PVDF | $1.0 \times 10^7$ or more |

Evaluation of Flexibility of Solar Cells

Example 25

A titanium oxide layer was manufactured on a PET film with ITO (manufactured by Aldrich, sheet resistance 60Ω/□) by a spin coating method using an aqueous dispersion liquid comprising titanium oxide particles (anatase type, TKS 201, manufactured by Tayca Corporation, solid content 33% by mass) having an average particle size of 6 nm. In addition, the thickness of the titanium oxide layer obtained as a result of drying at 120° C. for 10 minutes after spin coating was 1500 nm. A thin film was manufactured further on the titanium oxide layer by a spin coating method using a liquid obtained by diluting polyvinylidene fluoride (PVDF) with N-methyl pyrrolidone (NMP) to adjust the concentration to 5% by mass, and the thin film was dried at 120° C. for 1 minute. The thickness of the PVDF layer was 550 nm.

The flexibility was evaluated using the electrode substrate including the PET substrate, ITO, titanium oxide, and PVDF and a p-type silicon crystal wafer having a resistivity of 3 Ωcm which wafer had been washed with methanol.

Example 26

A titanium oxide layer was manufactured on a PET film with ITO (manufactured by Aldrich, sheet resistance 60Ω/□) by a spin coating method using an aqueous dispersion liquid comprising titanium oxide particles (anatase type, TKS 201, manufactured by Tayca Corporation, solid content 33% by mass) having an average particle size of 6 nm. In addition, the thickness of the titanium oxide layer obtained as a result of drying at 120° C. for 10 minutes after spin coating was 1500 nm. A film was produced further on the titanium oxide layer by a spin coating method using a liquid obtained by diluting cyanoethyl saccharose with 2-methoxyethanol to adjust the concentration to 20% by mass, and the film was dried at 120° C. for 1 minute. The thickness of the cyanoethyl saccharose layer was 600 nm.

The flexibility was evaluated using the electrode substrate including the PET substrate, ITO, titanium oxide, and cyanoethyl saccharose and a p-type silicon crystal wafer having a resistivity of 3 Ωcm which wafer had been washed with methanol.

The results of the evaluation of the flexibilities of Examples 25 and 26 are shown together in Table 12. It was confirmed that both of Examples 25 and 26 were driven as a solar cell when bent.

TABLE 12

| | Layer containing a compound having relative permittivity of 2 or more (junction interface layer) | Flexibility | Short-circuit current density (mA/cm$^2$) | Open-circuit voltage (V) | FF | Photoelectric conversion efficiency (%) |
|---|---|---|---|---|---|---|
| Example 25 | Polyvinylidene fluoride | Sufficient | 26.9 | 0.51 | 0.21 | 2.9 |
| Example 26 | Cyanoethyl saccharose | Sufficient | 15.5 | 0.52 | 0.19 | 1.5 |

Example 27

(1) Preparation of Silicon Particle-Containing Application Liquid for Forming Semiconductor Film Silicon particles were obtained under the same conditions as in Example 11. The average particle size of the obtained silicon particles was 43 μm.

The silicon particles were weighed after vacuum drying, and a glycerin/ethanol mixed solvent (mass ratio 1/3) and a 2-methoxyethanol solution of cyanoethyl polyvinyl alcohol were added and shaken. As a result thereof, an application liquid for forming a semiconductor film in which the silicon particles were dispersed in a glycerin/ethanol/2-methoxy ethanol mixed solution where cyanoethyl polyvinyl alcohol was dissolved, was prepared. With respect to the composition of the application liquid for forming a semiconductor film, the silicon particle was 20% by mass, cyanoethyl polyvinyl alcohol was 4% by mass, glycerin was 19% by mass, and ethanol was 57% by mass.

(2) Film Production

The application liquid for forming a semiconductor film was drop-cast on SUS 304 having a thickness of 10 μm and heated at 120° C. on a hot plate to thereby remove ethanol. After removing ethanol, heating was further conducted at 150° C. for 3 minutes to manufacture a substrate with a semiconductor film. With respect to the composition of the semiconductor film, the silicon particle was 80% by mass, cyanoethyl polyvinyl alcohol was 16% by mass, and the total amount of glycerin and compounds generated by oxidation of glycerin was 4% by mass. The relative permittivity of cyanoethyl polyvinyl alcohol was 15.

(3) Manufacture of Solar Cell

Using a PET film comprising ITO (manufactured by Aldrich, sheet resistance 60Ω/□) as a transparent electrode, an n-type semiconductor layer comprising titanium oxide was manufactured on the PET film. The n-type semiconductor layer was manufactured by a spin coating method using an aqueous dispersion liquid comprising titanium oxide particles (anatase type, TKS 201, manufactured by Tayca Corporation, solid content 33% by mass) having an average particle size of 6 nm. In addition, the thickness of the titanium oxide layer obtained as a result of drying at 120° C. for 10 minutes after spin coating was 600 nm. Coating was conducted by blade coating further on the titanium oxide layer with a liquid obtained by diluting cyanoethyl saccharose with 2-methoxyethanol to adjust the concentration to 20% by mass, and the coated liquid was dried at 120° C. for 1 minute. The thickness of the cyanoethyl saccharose layer was 600 nm. A solar cell was manufactured by sticking the substrate with the p-type semiconductor film on the layer thus obtained.

[Evaluation of Solar Cell Property 6]

The flexibility of the solar cell was evaluated. It was confirmed that Example 27 was driven as a solar cell (had flexibility) even when it was bent. In addition, when the open-circuit voltage was measured by irradiating with light, an open-circuit voltage of 0.6 V was confirmed. The open-circuit voltage was 0 V when the light was shielded.

INDUSTRIAL APPLICABILITY

According to the present invention, a semiconductor film which are suitably used for a semiconductor element, and a solar cell that is excellent in power generation efficiency by comprising a layer comprising the semiconductor film can be provided. Furthermore, according to the present invention, a solar cell that is excellent in power generation efficiency and is low cost, the solar cell comprising a junction interface layer, can be provided.

REFERENCE SIGNS LIST 1, 5 . . . Metal jig, 2 . . . Quartz plate, 3 . . . Silicon rubber, 9 . . . Screw, 10 . . . Light, 4, 100, 200, 300, 400, 500, 600, 700, 800, 900 . . . Solar cell; 110, 210, 310, 410, 510, 610, 710, 810, 910 . . . Substrate; 120, 220, 320, 420, 520, 620, 720, 820, 920 . . . Positive electrode layer; 130, 240, 330, 340, 430, 450, 530, 730, 850 . . . Layer comprising semiconductor film; 140, 650, 750, 940 . . . n-type semiconductor layer; 150, 250, 350, 460, 540, 660, 760, 860, 950 . . . Negative electrode layer; 230, 630, 830, 930 . . . p-type semiconductor layer; 440, 640, 740, 840 . . . Junction interface layer comprising compound having relative permittivity of 2 or more; 531 . . . p-type semiconductor particle; 532 . . . n-type semiconductor particle

The invention claimed is:

1. An application liquid for forming a semiconductor film, comprising:
   an inorganic semiconductor particle, wherein the inorganic semiconductor particle is a silicon particle having an average particle size of 1 to 400 μm; and
   a cyano group-containing organic compound,
   wherein a content of the inorganic semiconductor particle is 1 to 70% by mass, a content of the cyano group-containing organic compound having a relative permittivity of 2 or more is 0.5 to 70% by mass, and the content of the inorganic semiconductor particle is greater than the content of the cyano group-containing organic compound in the application liquid, and
   wherein the cyano group-containing organic compound comprises a compound selected from the group consisting of cyanoethyl pullulan, cyanoethyl polyvinyl alcohol, cyanoethyl saccharose, cyanoethyl cellulose, cyanoethyl hydroxyethyl cellulose, cyanoethyl starch, cyanoethyl hydroxypropyl starch, cyanoethyl glycidol pullulan, and cyanoethyl sorbitol.

2. The application liquid according to claim 1, wherein the application liquid further comprises a dispersant that adjusts a viscosity of the application liquid, wherein the dispersant is an alcohol, a glyclol, a cellosolve, a ketone, an ester, an ether, a hydrocarbon, or water.

3. The application liquid according to claim 2, wherein the alcohol is methanol, ethanol, propanol, butanol, or hexanol.

4. The application liquid according to claim 2, wherein the glycol is ethylene glycol or propylene glycol.

5. The application liquid according to claim 2, wherein the cellosolve is cellosolve, ethylcellosolve, or butylcellosolve.

6. The application liquid according to claim 2, wherein the ketone is acetone or methyl ethyl ketone.

7. The application liquid according to claim 2, wherein the ester is ethyl acetate or butyl acetate.

8. The application liquid according to claim 2, wherein the ether is dioxane or tetrahydrofuran.

9. The application liquid according to claim 2, wherein the hydrocarbon is benzene, toluene, xylene, trimethylbenzene, hexane, heptane, octane, nonane, decane, cyclohexane, decahydronaphthalene (decalin), or tetralin.

10. The application liquid according to claim 2, wherein a content of the dispersant is 1% by mass or more and 98.5% by mass or less.

11. The application liquid according to claim 2, wherein a content of the dispersant is 1% by mass or more and 76% by mass or less.

12. The application liquid according to claim 1, wherein the application liquid further comprises a compound having reducing power against the inorganic semiconductor particle.

13. The application liquid according to claim 12, wherein the compound having reducing power against the inorganic semiconductor particle is 3-allyloxy-1,2-propanediol, 1,3-bis(allyloxy)-2-propanol, 2,3-dihydroxybenzaldehyde, catechol, dipentaerythritol, allitol, talitol, iditol, glycerolethoxylate, 1,4-dithioerythritol, 1,4-disulfanyl-2,3-butanediol, maltotriose, glycolic acid, lactic acid, polycarbonate diols, polyester polyols, glyceraldehyde, glycolaldehyde, invertose, m-erythritol, alkylene glycols, ethylene glycol, polyethylene glycols, propylene glycol, polypropylene glycols, butanediol, pentanediol, hexanediol, polyalkylene glycols, diethylene glycol, triethylene glycol, tetraethylene glycol, propylene glycol, ethoxyethanol, butanediol, ethylene glycol monoethyl ether, diethylene glycol monoethyl ether, diethylene glycol diethyl ether, octanediol, dodecanediol, glycerin, glyceraldehyde, 3-allyloxy-1,2-propandediol, thioglycerol, 1,5-pentanediol, 1,12-dodecanedioic acid, pyrocatechol, 3-methoxycatechol, 1,2,3-butanethiol; an alcohol; or an amine-based material.

14. The application liquid according to claim 13, wherein the alcohol is ethanol, methanol, isopropyl alcohol, and 2-ethylhexyl alcohol.

15. The application liquid according to claim 13, wherein the amine-based material is hexylamine, heptylamine, octylamine, undecylamine, tridecylamine, tetradecylamine, pentadecylamine, cetylamine, dibutylamine, diamylamine, cyclohexylamine, aniline, naphtylamine, and toluidine.

16. The application liquid according to claim 12, wherein a content of the compound having reducing power against the inorganic semiconductor particle is 0.5% by mass or more and 90% by mass or less.

* * * * *